(12) United States Patent
Hsiao et al.

(10) Patent No.: US 10,062,518 B2
(45) Date of Patent: Aug. 28, 2018

(54) DYE-ADSORPTION METHOD AND APPARATUS THEREOF

(71) Applicants: Industrial Technology Research Institute, Chu-Tung (TW); Formosa Plastics Corporation, Kaohsiung (TW)

(72) Inventors: Po-Tsung Hsiao, Taoyuan (TW); Jung-Pin Chiou, Zhubei (TW); Yung-Liang Tung, Zhudong Township (TW); Chih-Chou Chang, Kaohsiung (TW); Liang-Kun Huang, Kaohsiung (TW); Po-Min Chen, Kaohsiung (TW); Wan-Tun Hung, Kaohsiung (TW)

(73) Assignees: Industrial Technology Research Institute, Chu-Tung (TW); Formosa Plastics Corporation, Kaohsiung (TW)

( * ) Notice: Subject to any disclaimer, the term of this patent is extended or adjusted under 35 U.S.C. 154(b) by 0 days.

(21) Appl. No.: 15/905,726

(22) Filed: Feb. 26, 2018

(65) Prior Publication Data

US 2018/0182559 A1 Jun. 28, 2018

Related U.S. Application Data

(62) Division of application No. 15/346,435, filed on Nov. 8, 2016.

(30) Foreign Application Priority Data

Jul. 14, 2016 (TW) .............................. 105122294 A

(51) Int. Cl.
*H01G 9/00* (2006.01)
*H01G 9/20* (2006.01)
(Continued)

(52) U.S. Cl.
CPC .......... *H01G 9/0029* (2013.01); *H01G 9/2027* (2013.01); *H01G 9/2059* (2013.01); *H01L 31/0224* (2013.01); *H01L 31/1884* (2013.01)

(58) Field of Classification Search
None
See application file for complete search history.

(56) References Cited

U.S. PATENT DOCUMENTS

2010/0230046 A1* 9/2010 Park ...................... H01G 9/2068
156/278
2010/0304524 A1* 12/2010 Myong ............ H01L 31/022433
438/73
(Continued)

FOREIGN PATENT DOCUMENTS

CN 101755316 6/2010
JP 2013110066 A 6/2013
(Continued)

OTHER PUBLICATIONS

Taiwan Patent Office, "Office Action," issued in connection with Taiwan Patent Application No. 105122294, dated Jul. 13, 2017, 18 pages.
United States Patent & Trademark Office, "Restriction Requirement," issued in connection with U.S. Appl. No. 15/346,435, dated Jan. 16, 2018, 7 pages.

*Primary Examiner* — Angel Roman
(74) *Attorney, Agent, or Firm* — Hanley, Flight & Zimmerman, LLC

(57) ABSTRACT

A dye adsorption method and a dye adsorption apparatus is provided in this disclosure. The dye adsorption method includes a dye adsorption step. In the dye adsorption step, a dye is injected into and flowed through a space between two electrodes of a solar cell facing each other to obtain at least one dye-adsorbed electrode.

10 Claims, 21 Drawing Sheets
(4 of 21 Drawing Sheet(s) Filed in Color)

(51) Int. Cl.
*H01L 31/0224* (2006.01)
*H01L 31/18* (2006.01)

(56) References Cited

U.S. PATENT DOCUMENTS

| | | | | |
|---|---|---|---|---|
| 2011/0300770 A1* | 12/2011 | Fukuda | ................ | B32B 15/08 |
| | | | | 445/58 |
| 2012/0070933 A1* | 3/2012 | Kim | ................ | H01G 9/2068 |
| | | | | 438/64 |
| 2013/0034930 A1* | 2/2013 | Hayashi | ................ | H01G 9/2068 |
| | | | | 438/82 |
| 2013/0316485 A1* | 11/2013 | Furutani | ................ | H01L 21/67057 |
| | | | | 438/57 |
| 2013/0323934 A1* | 12/2013 | Wada | ................ | H01G 9/2068 |
| | | | | 438/758 |
| 2014/0102526 A1* | 4/2014 | Matsuo | ................ | H01G 9/2068 |
| | | | | 136/255 |
| 2014/0124021 A1 | 5/2014 | Ladanov et al. | | |
| 2014/0290746 A1* | 10/2014 | Tani | ................ | C07D 213/79 |
| | | | | 136/263 |
| 2016/0343516 A1* | 11/2016 | Mehmood | ................ | H01G 9/2059 |
| 2018/0019065 A1 | 1/2018 | Hsiao et al. | | |

FOREIGN PATENT DOCUMENTS

| | | |
|---|---|---|
| KR | 20110026219 A | 3/2011 |
| KR | 101442119 B1 | 11/2014 |
| TW | 200933714 | 8/2009 |
| TW | 201111767 | 4/2011 |
| TW | 201327864 | 7/2013 |
| TW | I406424 | 8/2013 |
| TW | 201349640 A | 12/2013 |
| TW | I444234 | 7/2014 |
| TW | 201517352 A | 5/2015 |

* cited by examiner

DYE-ADSORPTION METHOD AND APPARATUS THEREOF

CROSS-REFERENCE TO RELATED APPLICATIONS

This application arises from a divisional of U.S. Non-Provisional patent application Ser. No. 15/346,435, filed Nov. 8, 2016, which claims priority under 35 U.S.C. § 119(a) on Patent Application No(s). 105122294 filed in Taiwan, R.O.C. on Jul. 14, 2016. The entire contents of patent application Ser. No. 15/346,435 and Patent Application No(s). 105122294 are hereby incorporated by reference.

BACKGROUND

Dye sensitized solar cell (DSSC) is a kind of solar cell with nanofilm. The anode of the DSSC has porous structure formed by nanoparticles of metal-oxide-semiconductor, and the dye molecules are adsorbed on the surface of the porous structure and form chemical bonding with the metal-oxide-semiconductor. When the dye molecules absorb the optical energy, some electrons in the dye molecules jump to the conduction band and flow to the anode through the metal-oxide-semiconductor to generate the photocurrent. The advantage of the DSSC includes low cost of the raw materials, simple manufacturing process, and simple manufacturing equipments; therefore, the DSSC has the lowest manufacturing cost in the various kinds of the conventional solar cells.

SUMMARY

One embodiment of the disclosure provides a dye adsorption apparatus including a multi-way control valve, an electrode jig, a dye container, a liquid-driving pump, and a cleaning-liquid container. The multi-way control valve is configured to be changeable between a first communicating state and a second communicating state. The electrode jig has a jig inlet and a jig outlet, and the electrode jig is configured to fix two electrodes facing each other. The jig inlet, the jig outlet, and a space between the two electrodes are communicable to each other. The dye container has a dye outlet and a dye inlet. The liquid-driving pump is located between the electrode jig and the multi-way control valve. The cleaning-liquid container has a cleaning-liquid outlet and a cleaning-liquid inlet. When the multi-way control valve is at the first communicating state, the dye outlet is communicated to the jig inlet through the multi-way control valve, and the dye inlet is communicated to the jig outlet through the multi-way control valve. When the multi-way control valve is at the second communicating state, the cleaning-liquid outlet is communicated to the jig inlet through the multi-way control valve, and the cleaning-liquid inlet is communicated to the jig outlet through the multi-way control valve.

Another embodiment of the disclosure provides a dye adsorption method including a dye adsorption step. In the dye adsorption step, a dye is injected into and flowed through a space between two electrodes of a solar cell facing each other to obtain at least one dye-adsorbed electrode.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The disclosure will become better understood from the detailed description given hereinbelow and the accompanying drawings which are given by way of illustration only and thus are not limitative of the present disclosure and wherein.

DETAILED DESCRIPTION

Figure 1:
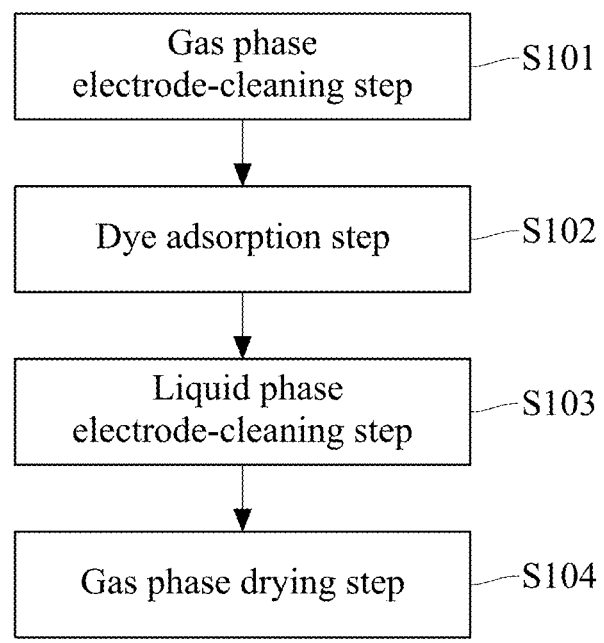
FIG. 1 is a flow chart of a dye-adsorption method of electrodes according to an embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

In the disclosure, the terms "top" and "bottom" mean two opposite directions in the drawings for providing a through understanding of the disclosed embodiments in the following descriptions but are not limitations of the disclosure. The terms "on" and "under" mean two opposite positions of an object in the drawings for providing a through understanding of the disclosed embodiments in the following descriptions but are not limitations of the disclosure.

Dye sensitized solar cell (DSSC) includes a cathode, an anode, and an electrolyte. The cathode can include a conductive glass made of fluorine-doped tin oxide (FTO) and a platinum layer covering a surface of the conductive glass. The anode can include another conductive glass made of FTO, a porous structure covering a surface of the conductive glass, and a dye adsorbed on a surface of the porous structure. The porous structure is formed at least by nanoparticles of metal-oxide-semiconductor, and the metal-oxide-semiconductor, for example, is titanium dioxide. The dye is an organic dye or an organometallic coordination complex dye such as an organometallic coordination complex with ruthenium or zinc coordination centre and having an electron-donating group, a $\pi$ bond, and an electron-accepting group. The platinum layer on the cathode and the porous structure on the anode face each other. A surrounding edge of the cathode and a surrounding edge of the anode are sealed together by an encapsulation material. The electrolyte is sealed between the cathode and the anode to transmit electrodes between the cathode and the anode. The electrolyte, for example, is an organic solution which has triiodide ions ($I_3^-$) and iodide ions ($I^-$) dissolved in.

The followings are illustrations about a dye-adsorption method, which can be applied on electrodes of a solar cell, in an embodiment of the disclosure. A dye-adsorption method, which can be applied on electrodes of a solar cell, in an embodiment of the disclosure includes a dye adsorption step, wherein a dye is injected and flows through a space between two electrodes facing each other. Please refer to FIG. 1, FIG. 1 is a flow chart of a dye-adsorption method according to an embodiment of the disclosure. The two electrodes in this embodiment of the disclosure are a cathode and an anode in a dye sensitized solar cell, respectively. The cathode, which does not adsorb the dye, includes a conductive glass and a platinum layer coated on a surface of the conductive glass. The anode includes a conductive glass and a porous structure disposed on a surface of the conductive glass. An encapsulation material located at the surrounding edge of the cathode and the surrounding edge of the anode seals the anode and the cathode and leaves a space between the anode and the cathode. The cathode has an electrode inlet and an electrode outlet on an area of the conductive glass, and the area is not covered by the platinum layer. The electrode inlet, the electrode outlet, and the space between the cathode and the anode are communicated with each other. In other embodiments of the disclosure, the electrode inlet and the electrode outlet can also be located on other areas of the cathode or the anode.

The steps in the dye-adsorption method in an embodiment of the disclosure are illustrated in the following paragraphs.

First, perform a gas phase electrode-cleaning step (S101).

In detail, the gas phase electrode-cleaning step includes a cleaning gas injection step and a cleaning gas discharge step performed after the cleaning gas injection step. The cleaning gas injection step includes injecting a cleaning-gas into the space, and making the cleaning-gas flow through the space between the two electrodes facing each other. The cleaning gas discharge step includes discharging the cleaning gas in the space between the two electrodes so as to keep the space at a vacuum state. The cleaning-gas enters and discharges from the space between the two electrodes through the electrode inlet and the electrode outlet. Impurities located between the two electrodes are removed with the cleaning-gas discharging from the space between the two electrodes so that an exposed surface area of the porous structure on the electrode surface is increased. Therefore, more dye can be adsorbed on the surface of the porous structure in the following dye adsorption step. The cleaning-gas, for example, is nitrogen or inert gas. The step of injecting the cleaning-gas into the space and the step of discharging the cleaning-gas out of the space can be repeated several times for improving the cleaning effect of the gas phase electrode-cleaning step.

Next, perform a dye adsorption step (S102).

In detail, the dye adsorption step includes a dye injection step and a dye removing step performed after the dye injection step. The dye injection step includes injecting the dye into the space between the two electrodes, and making the dye flow forward through the space to obtain at least one dye-adsorbed electrode. The dye removing step includes removing the residual dye backward from the space after the surface of the porous structure has uniformly adsorbed the dye. In the step of injecting the dye into the space and making the dye flow forward through the space, the dye filled in the space is pushed by the following injected dye so as to enter pores of the porous structure on the electrode surface. The pushing force applied on the dye filled in the space improves a velocity of the dye moving into the pores of the porous structure. Moreover, the pushing force applied on the dye filled in the space also help the dye to overcome an interference caused by a surface tension which interferes the dye enter the small pores, and therefore, the dye can be uniformly distributed in the porous structure. At an interface of the dye and the porous structure made by metal-oxide-semiconductor, chemical bonds are formed between the dye and the metal-oxide-semiconductor by dehydration so that the dye is adsorbed by the electrode with porous structure to obtain the dye-adsorbed electrode. As electrons of the dye absorb light energy and being turned to high-energy electrons, the chemical bonds between the dye and the metal-oxide-semiconductor are moving paths of the high-energy electrons from the dye to the anode.

The dye can be organic dye or organometallic coordination complex dye such as an organometallic coordination complex with ruthenium or zinc coordination centre having at least one electron-donating group, at least one $\pi$ bond, and at least one electron-accepting group. The metal-oxide-semiconductor, which constructs the porous structure, can be titanium dioxide. A temperature of the two electrodes in the dye adsorption step is, for example, 20° C. to 60° C. If the temperature of the two electrodes is too low, such as lower than 20° C., a reaction rate of the dehydration between the dye and the metal-oxide-semiconductor is too slow so that a time cost of the dye adsorption method is increased. If the temperature of the two electrodes is too high, such as higher than 60° C., a thermal denaturation of the dye may occur, and a photoelectric conversion efficiency of the dye is decreased.

Next, perform a liquid phase electrode-cleaning step (S103).

In detail, the liquid phase electrode-cleaning step includes a cleaning liquid injection step and a cleaning liquid discharge step performed after the cleaning liquid injection step. The cleaning liquid injection step includes injecting a cleaning liquid into the space, and making the cleaning liquid flow forward through the space between the two electrodes. One of the two electrodes, which has the dye adsorbed by the porous structure on the electrode, becomes the dye-adsorbed electrode after the dye adsorption step. A part of the dye adsorbed on the surface of the porous structure, which has no chemical bonds between the dye and the metal-oxide-semiconductor, is removed from the surface of the porous structure by the cleaning liquid in the liquid phase electrode-cleaning step. The cleaning liquid discharge step includes discharging the cleaning liquid backward from the space.

In the dye adsorbed by the porous structure, only a first layer of the dye, which is in direct contact with the surface of the porous structure, on the surface of the porous structure forms chemical bonds with the metal-oxide-semiconductor of the porous structure. A second layer and even the third layer of the dye are adsorbed on the surface of the porous structure by the electrostatic force between each layer of the dye. When the cleaning-liquid flow through the space between the electrode and the dye-adsorbed electrode, the second layer and the third layer of the dye are dissolved in the cleaning-liquid and removed from the surface of the porous structure, and the first layer of the dye bonding to the surface of the porous structure with chemical bonds is left on the surface of the porous structure. The cleaning-liquid can include alcohol, nitrile, or any solvent which can dissolve the organic dye or the organometallic coordination complex dye.

When the dye absorbs photo energy, some of electrons of the dye are excited and jump to the conduction band of the dye. The electrons with high energy in the first layer of the dye are transmitted to the anode through the chemical bonds between the dye and the metal-oxide-semiconductor to generate an electron flow, but the electrons with high energy in the second and the third layer of the dye which are adsorbed on the porous structure by physical bonding cannot be transmitted to the anode to generate the electron flow. Moreover, the first layer of the dye which has lost an electron needs to acquire an electron from the electrolyte to go back to an electrically neutral condition, but the contact between the electrolyte and the first layer of the dye is blocked by the second layer and the third layer of the dye covering the first layer of the dye. Therefore, the first layer of the dye cannot be reduced to the electrically neutral condition by the electrolyte. Since the dye in the first layer cannot go back to the electrically neutral condition, the first layer of the dye cannot absorb the photo energy and provide the electrons with high energy to the anode repeatedly so that the current generated by the solar cell is gradually decreased. As a result, the liquid phase electrode-cleaning step is performed for removing the unnecessary second and third layer of the dye after the dye adsorption step so that a stability of current generated by the solar cell can be maintained.

Next, perform a gas phase drying step (S104).

In detail, the gas phase drying step includes a drying gas injection step and a drying gas discharge step performed after the drying gas injection step. The drying gas injection step includes injecting a drying gas into the space, and making the drying gas flow through the space. The drying gas discharge step includes discharging the drying gas to keep the space at the vacuum state. The drying gas entering and leaving the space facilitates the evaporation of the residual cleaning-liquid in the space and bring the vaporized cleaning-liquid to leave the space with the drying gas together. The cleaning-gas is, for example, nitrogen or inert gas. The step of injecting the drying gas into the space and the step of discharging the drying gas out of the space can be repeated several times for improving the drying effect of the gas phase drying step.

The dye-adsorption method in the disclosure includes injecting the dye into the space between the two electrodes, and flowing through the space so that the dye is adsorbed on a surface of one of the electrodes to obtain a dye-adsorbed electrode. Since the dye filled in the space is pushed by the following injected dye, the movement of the dye moving into the pores of the porous structure is accelerated. Moreover, an amount of the dye which is about to fill the space between the two electrodes is enough to perform the dye-adsorption method in the disclosure. There in no necessary to prepare an amount of the dye which the electrodes can be totally immersed in when performing the conventional dye adsorption method. In addition, the pushing force applied on the dye helps the dye to overcome an interference caused by the surface tension so that the dye enters the small pores more easily, and a total surface area which adsorbs the dye is improved, and the dye can be uniformly distributed in the pores with different radius; therefore, the efficiency of the solar cell is improved.

Moreover, as mentioned above, the electrode is totally immersed in the dye in the conventional dye adsorption method so that the dye in a dye container can enter the porous structure on the electrode by diffusion and capillarity. Therefore, a velocity and an amount of the dye entering the porous structure are difficult to be controlled, and thereby, the stability of the electrodes manufactured in different batch needs to be improved. In contrast, the dye is injected and flow through the space between the two electrodes in the dye-adsorption method of the disclosure so that the injection force applied on the dye also push the dye to move into the porous structure on the electrode surface. Therefore, adjusting the injection speed of the dye, which is proportion to the injection force of the dye, can adjust the velocity and amount of the dye entering the porous structure so that the stability of the electrodes manufactured in different batch is improved.

In addition, when the electrode of the dye sensitized solar cell is a multicolor electrode, the anode is divided into several areas, and each area is isolated by encapsulation material and has a pair of electrode inlet and electrode outlet. As a result, the dye-adsorption method in the disclosure can inject several different dyes into different areas on the anode, respectively, to manufacture the multicolor electrode.

In addition, the cathode and the anode are encapsulated before injection of the dye in the disclosure so that the contact surfaces between the encapsulation material and the anode and the cathode are not contacted by the dye. In the conventional dye-adsorption method, after immersing the electrode in the dye container to adsorb the dye, some of the residual dye at the contact area between the anode and the encapsulation material may affect the attaching ability of the encapsulation material and further affect the sealing effect of the encapsulation material. As a result, the side effect about the attaching ability of the encapsulation material can be avoided if the dye is adsorbed by the dye-adsorption method of the disclosure.

Figure 2A:
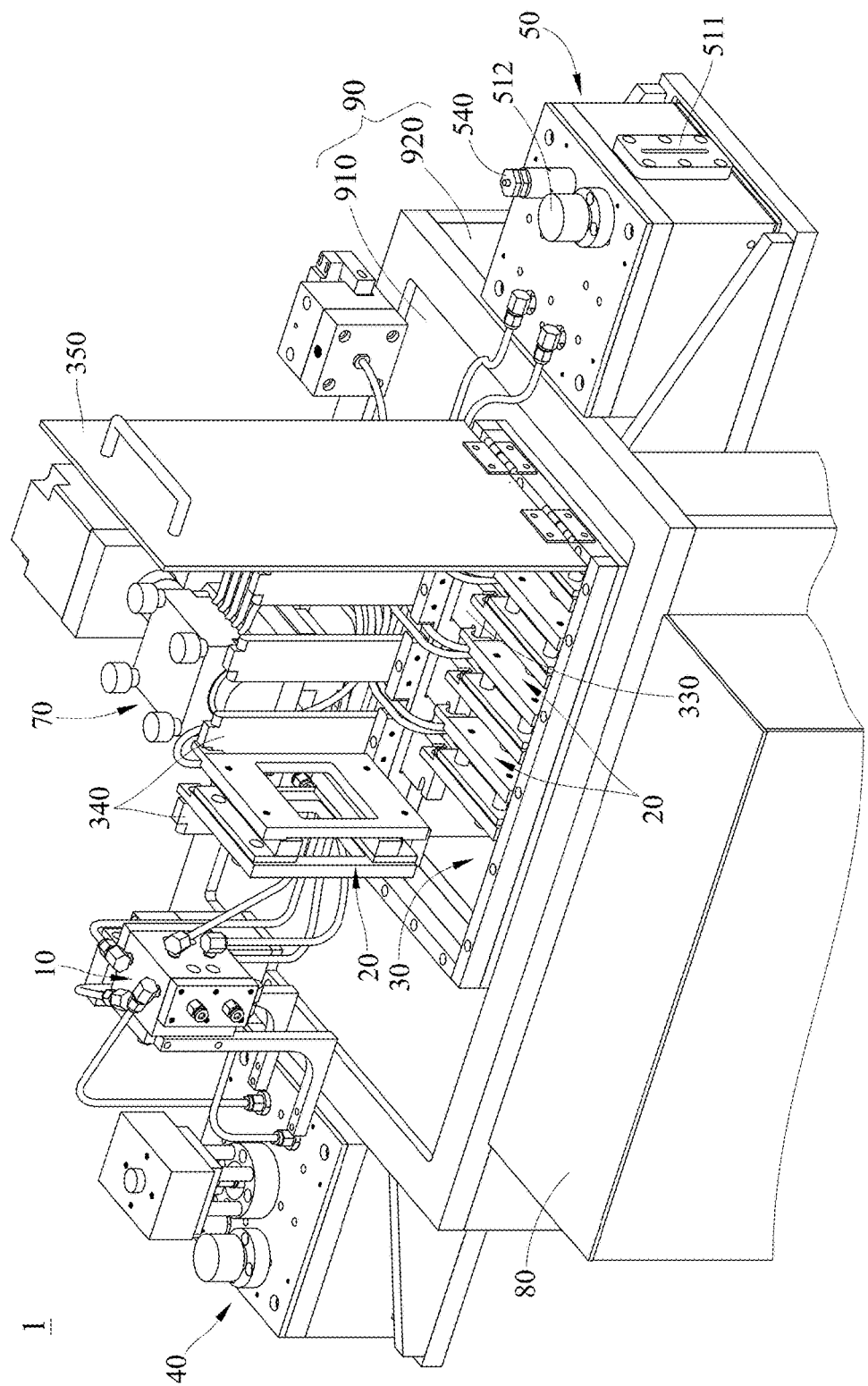
FIG. 2A and FIG. 2B are schematic views of a dye-adsorption apparatus of electrodes in different viewing angles according to an embodiment of the disclosure.
Figure 2B:
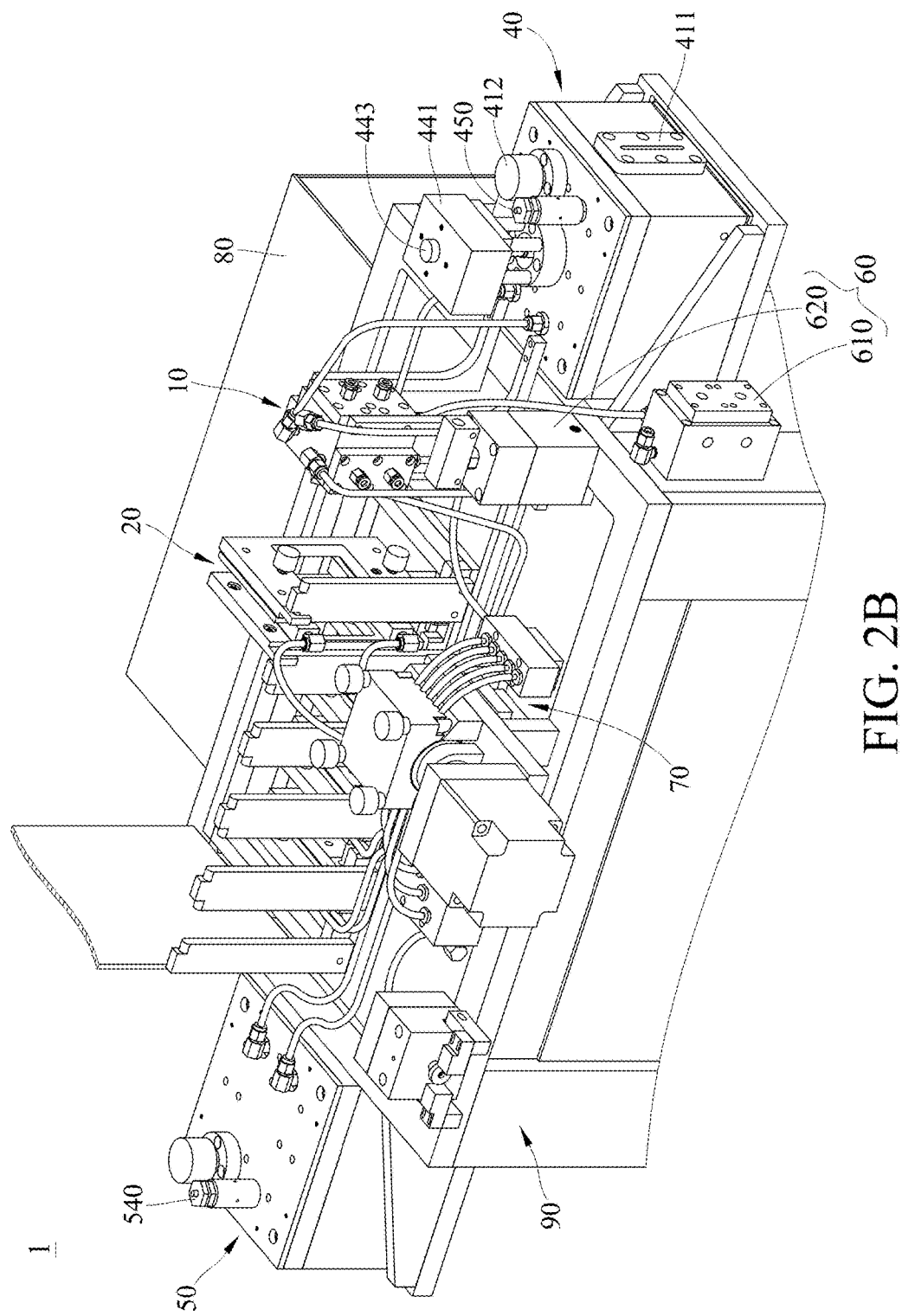
Figure 3:
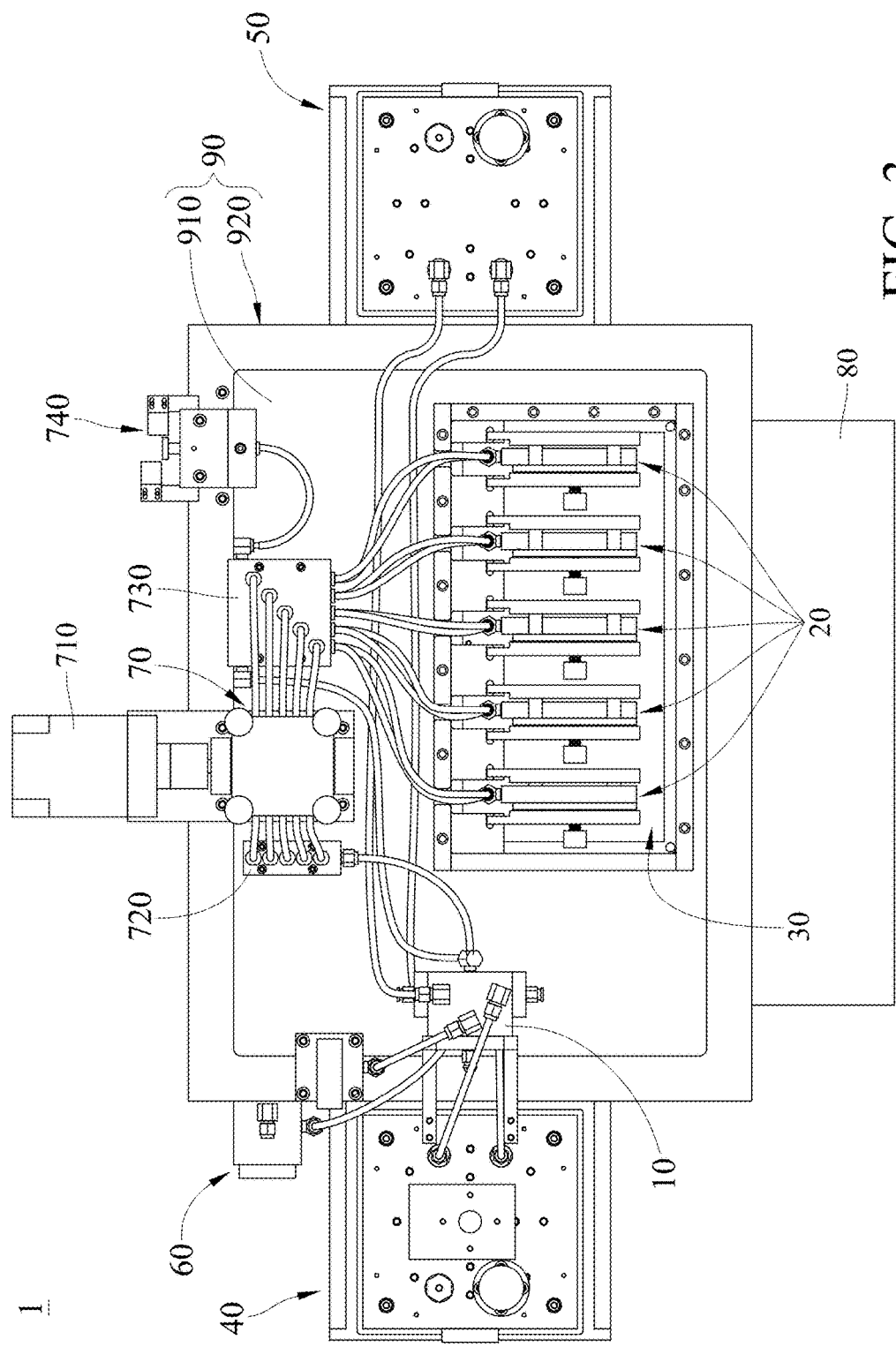
FIG. 3 is a top view of a dye-adsorption apparatus of electrodes according to an embodiment of the disclosure.

The dye-adsorption method is performed by a dye-adsorption apparatus of the disclosure to manufacture an electrode with a dye adsorbed on an electrode surface. The dye-adsorption apparatus in the disclosure is illustrated in the following paragraphs. Please refer to FIG. 2A to FIG. 4. FIG. 2A and FIG. 2B are schematic views of a dye-adsorption apparatus of electrodes in different viewing angles according to an embodiment of the disclosure. FIG.

Figure 4:
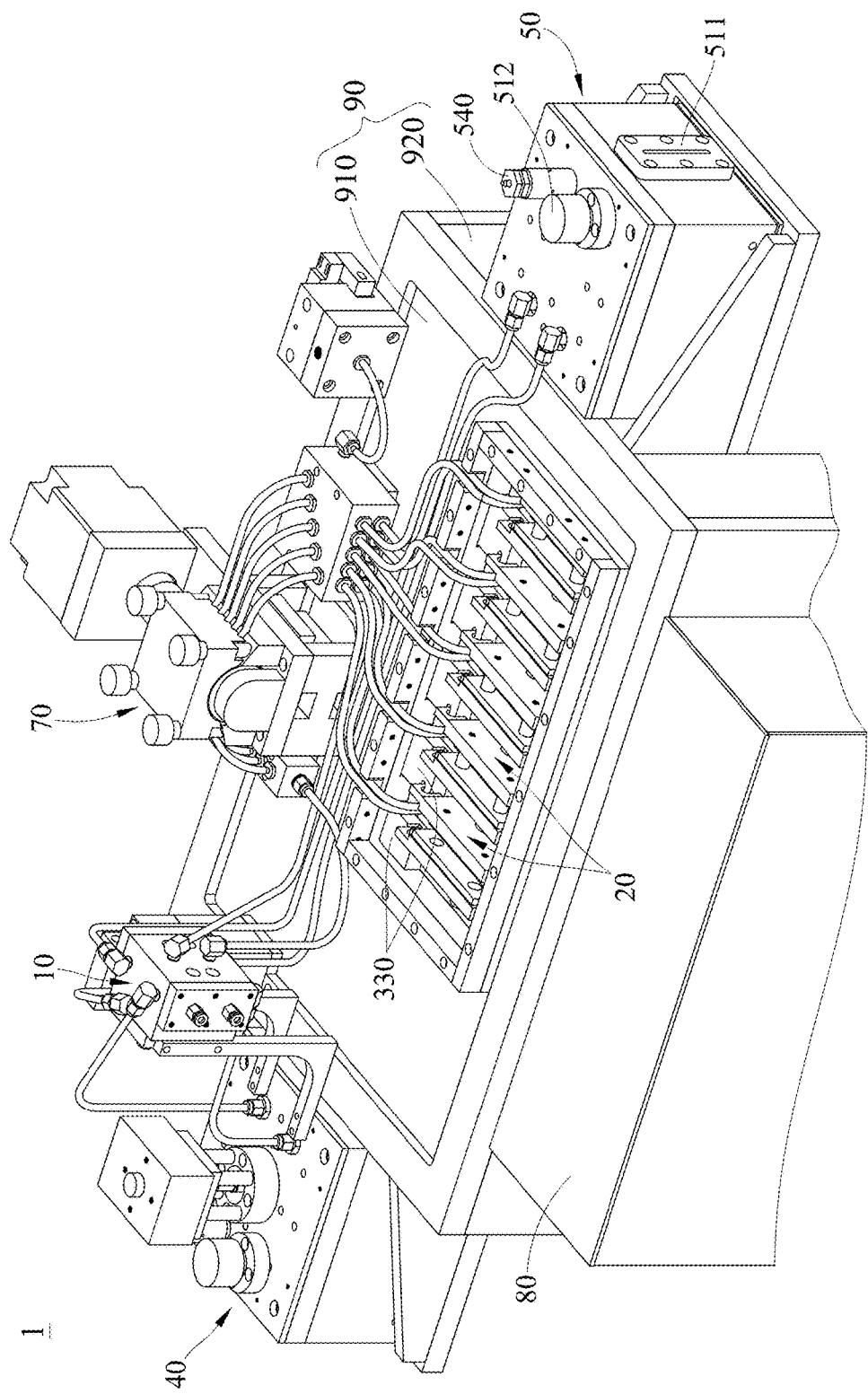
FIG. 4 is a schematic view of a dye-adsorption apparatus of electrodes with outer frames and a cover being eliminated according to an embodiment of the disclosure.

3 is a top view of a dye-adsorption apparatus of electrodes according to an embodiment of the disclosure. FIG. 4 is a schematic view of a dye-adsorption apparatus of electrodes with outer frames and a cover being eliminated according to an embodiment of the disclosure. A structure of two electrodes for illustrating the dye-adsorption apparatus in an embodiment of the disclosure is similar to the structure of the two electrodes in the above paragraphs regarding to the embodiment of the dye-adsorption method; therefore, the illustration of the two electrodes is not repeated hereafter.

A dye-adsorption apparatus 1 includes a multi-way control valve 10, five electrode jigs 20, an electrode temperature control module 30, a dye container 40, a cleaning-liquid container 50, a gas supply module 60, a fluid transmitting module 70, a controller 80, and a main body 90. The multi-way control valve 10, the fluid transmitting module 70, and the electrode temperature control module 30 are installed on a supporting surface 910 of the main body 90. The electrode jigs 20 are installed in the electrode temperature control module 30. The dye container 40, the cleaning-liquid container 50, the gas supply module 60, and the controller 80 are installed on a side surface 920 of the main body 90. The supporting surface 910 is surrounded by the side surface 920.

Figure 5A:
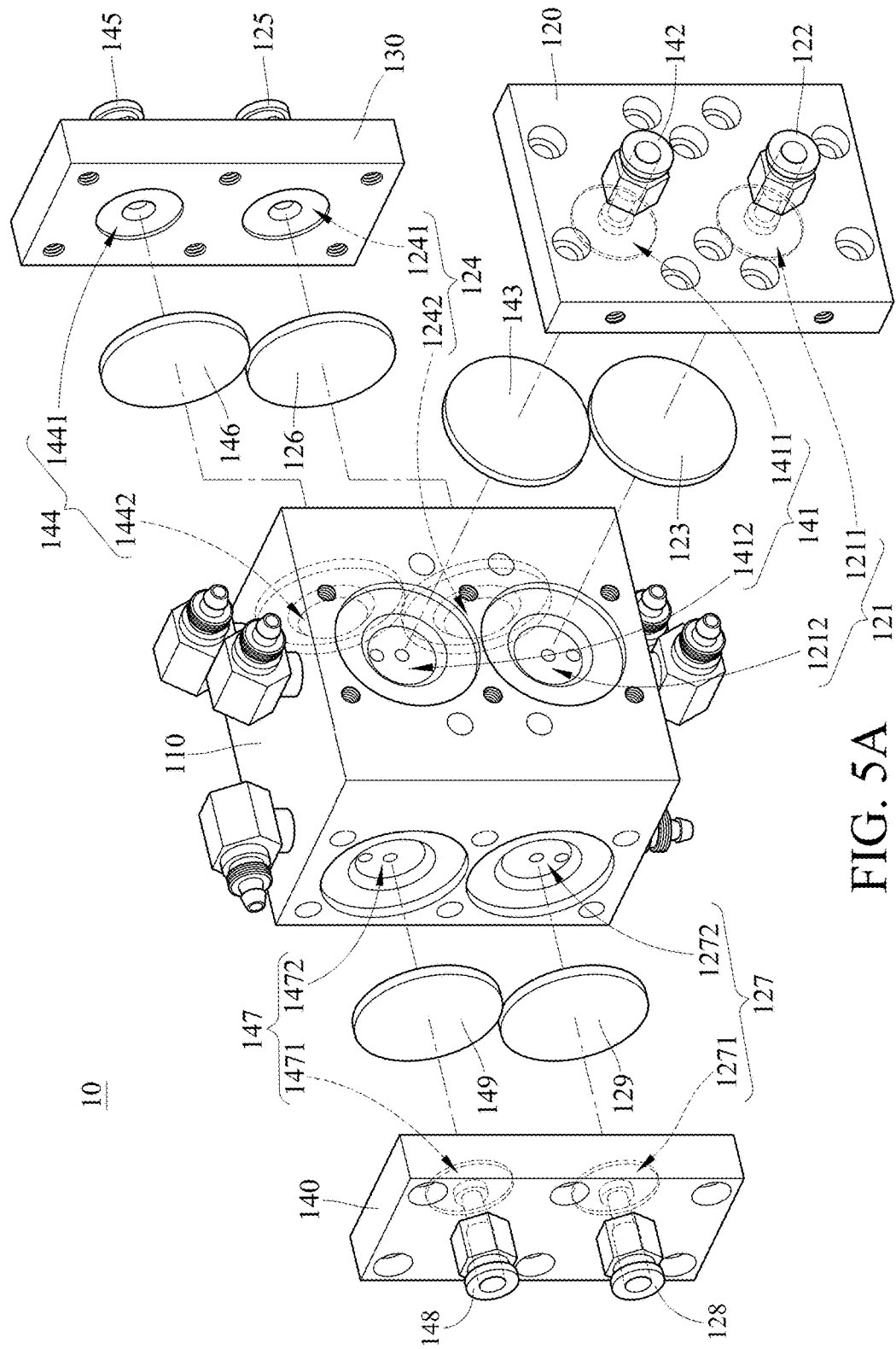
FIG. 5A is an exploded view of a multi-way control valve in a dye-adsorption apparatus according to an embodiment of the disclosure.
Figure 5B:
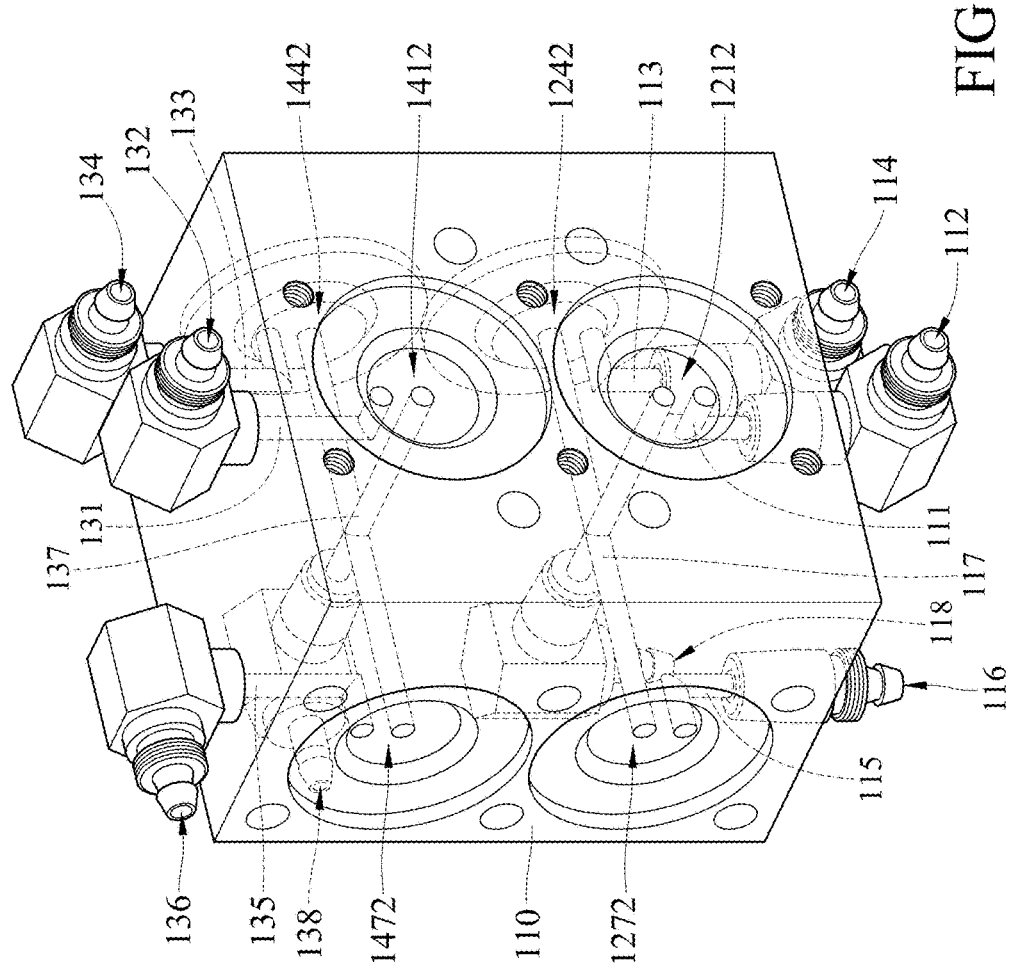
FIG. 5B is a perspective view of a base body of the multi-way control valve in FIG. 5A.
Figure 6:
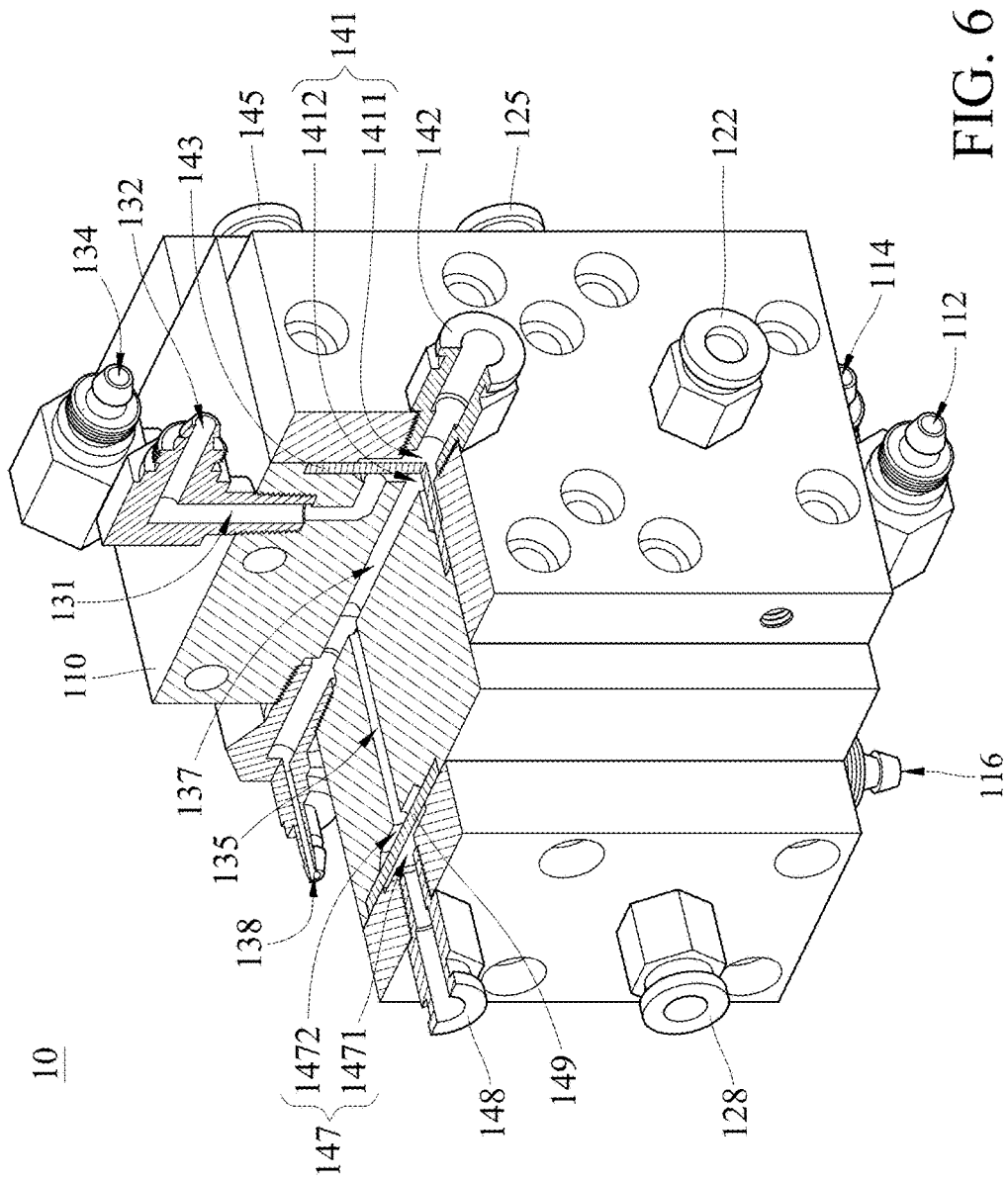
FIG. 6 is a partial cross-sectional view of a multi-way control valve in a dye-adsorption apparatus according to an embodiment of the disclosure.

Firstly, the multi-way control valve 10 is illustrated in the following paragraphs. Please refer to FIG. 5A to FIG. 6. FIG. 5A is an exploded view of a multi-way control valve in a dye-adsorption apparatus according to an embodiment of the disclosure. FIG. 5B is a perspective view of a base body of the multi-way control valve in FIG. 5A. FIG. 6 is a partial cross-sectional view of a multi-way control valve in a dye-adsorption apparatus according to an embodiment of the disclosure.

The multi-way control valve 10 includes a base body 110, a gas control valve 120, a dye control valve 130, a cleaning-liquid control valve 140, a gas injection control port 122, a gas injection control shim 123, a dye injection control port 125, a dye injection control shim 126, a cleaning-liquid injection control port 128, a cleaning-liquid injection control shim 129, a gas recycling control port 142, a gas recycling control shim 143, a dye recycling control port 145, a dye recycling control shim 146, a cleaning-liquid recycling control space 148, a cleaning-liquid recycling control shim 149, and a control gas source (not shown). The base body 110 has a gas injection path 111, a gas injection port 112, a gas injection control space 121, a dye injection path 113, a dye injection port 114, a dye injection control space 124, a cleaning-liquid injection path 115, a cleaning-liquid injection port 116, a cleaning-liquid injection control space 127, an injection path 117, and an injection port 118. The control gas source (not shown) is configured for providing a control gas to the gas injection control port 122, the dye injection control port 125, the cleaning-liquid injection control port 128, the gas recycling control port 142, the dye recycling control port 145, and the cleaning-liquid recycling control port 148.

The gas control valve 120 is assembled to the base body 110, and the gas injection control space 121 is formed between the gas control valve 120 and the base body 110. The gas injection control shim 123 is located in the gas injection control space 121, and the gas injection control space 121 is divided into a first gas injection control space 1211 and a second gas injection control space 1212 by the gas injection control shim 123. The gas injection control port 122 and the first gas injection control space 1211 are communicated with each other. The gas injection port 112 is located at an end of the gas injection path 111, and an opposite end of the gas injection path 111 is communicated to one of branches of the injection path 117 through the second gas injection control space 1212. When the control gas is injected into the first gas injection control space 1211 through the gas injection control port 122, the gas injection control shim 123 is pressed and elastically deformed to block the branch of the injection path 117 communicating the second gas injection control space 1212 so that the gas injection path 111 and the injection path 117 are not communicated with each other. When the control gas is not injected into the first gas injection control space 1211 through the gas injection control port 122, the gas injection control shim 123 is not pressed and maintaining an original shape so that the gas injection path 111 and the injection path 117 are communicated with each other.

The dye control valve 130 is assembled to the base body 110, and the dye injection control space 124 is formed between the dye control valve 130 and the base body 110. The dye injection control shim 126 is located in the dye injection control space 124, and the dye injection control space 124 is divided into a first dye injection control space 1241 and a second dye injection control space 1242 by the dye injection control shim 126. The dye injection control port 125 and the first dye injection control space 1241 are communicated with each other. The dye injection port 114 is located at an end of the dye injection path 113, and an opposite end of the dye injection path 113 is communicated to one of branches of the injection path 117 through the second dye injection control space 1242. When the control gas is injected into the first dye injection control space 1241 through the dye injection control port 125, the dye injection control shim 126 is pressed and elastically deformed to block the branch of the injection path 117 communicating to the second dye injection control space 1242 so that the dye injection path 113 and the injection path 117 are not communicated with each other. When the control gas is not injected into the first dye injection control space 1241 through the dye injection control port 125, the dye injection control shim 126 is not pressed and maintaining an original shape so that the dye injection path 113 and the injection path 117 are communicated with each other.

The cleaning-liquid control valve 140 is assembled to the base body 110, and the cleaning-liquid injection control space 127 is formed between the cleaning-liquid control valve 140 and the base body 110. The cleaning-liquid injection control shim 129 is located in the cleaning-liquid injection control space 127, and the cleaning-liquid injection control space 127 is divided into a first cleaning-liquid injection control space 1271 and a second cleaning-liquid injection control space 1272 by the cleaning-liquid injection control shim 129. The cleaning-liquid injection control port 128 and the first cleaning-liquid injection control space 1271 are communicated to each other. The cleaning-liquid injection port 116 is located at an end of the cleaning-liquid injection path 115, and an opposite end of the cleaning-liquid injection path 115 is communicated to one of branches of the injection path 117 through the second cleaning-liquid injection control space 1272. When the control gas is injected into the first cleaning-liquid injection control space 1271 through the cleaning-liquid injection control port 128, the cleaning-liquid injection control shim 129 is pressed and elastically deformed to block the branch of the injection path 117 communicating to the second cleaning-liquid injection control space 1272 so that the cleaning-liquid injection path 115 and the injection path 117 are not communicated with each other. When the control gas is not injected into the first cleaning-liquid injection control space 1271 through the cleaning-liquid injection control port 128, the cleaning-liquid injection control shim 129 is not pressed and maintaining an original shape so that the cleaning-liquid injection path 115 and the injection path 117 are communicated with each other.

The base body 110 further has a gas recycling path 131, a gas recycling port 132, a gas recycling control space 141, a dye recycling path 133, a dye recycling port 134, a dye recycling control space 144, a cleaning-liquid recycling path 135, a cleaning-liquid recycling port 136, a cleaning-liquid recycling control space 147, a recycling path 137, and a recycling port 138.

The gas control valve 120 is assembled to the base body 110, and the gas recycling control space 141 is formed between the gas control valve 120 and the base body 110. The gas recycling control shim 143 is located in the recycling control space 141, and the gas recycling control space 141 is divided into a first gas recycling control space 1411 and a second gas recycling control space 1412 by the gas recycling control shim 143. The gas recycling control port 142 and the first gas recycling control space 1411 are communicated with each other. The gas recycling port 132 is located at an end of the gas recycling path 131, and an opposite end of the gas recycling path 131 is communicated to one of branches of the recycling path 137 through the second gas recycling control space 1412. When the control gas is injected into the first gas recycling control space 1411 through the gas recycling control port 142, the gas recycling control shim 143 is pressed and elastically deformed to block the branch of the recycling path 137 communicating to the second gas recycling control space 1412 so that the gas recycling path 131 and the recycling path 137 are not communicated with each other. When the control gas is not injected into the first gas recycling control space 1411 through the gas recycling control port 142, the gas recycling control shim 143 is not pressed and maintaining an original shape so that the gas recycling path 131 and the recycling path 137 are communicated with each other.

The dye control valve 130 is assembled to the base body 110, and the dye recycling control space 144 is formed between the dye control valve 130 and the base body 110. The dye recycling control shim 146 is located in the dye recycling control space 144, and the dye recycling control space 144 is divided into a first dye recycling control space 1441 and a second dye recycling control space 1442 by the dye recycling control shim 146. The dye recycling control port 145 and the first dye recycling control space 1441 are communicated with each other. The dye recycling port 134 is located at an end of the dye recycling path 133, and an opposite end of the dye recycling path 133 is communicated to one of branches of the recycling path 137 through the second dye recycling control space 1442. When the control gas is injected into the first dye recycling control space 1441 through the dye recycling control port 145, the dye recycling control shim 146 is pressed and elastically deformed to block the branch of the recycling path 137 communicating to the second dye recycling control space 1442 so that the dye recycling path 133 and the recycling path 137 are not communicated with each other. When the control gas is not injected into the first dye recycling control space 1441 through the dye recycling control port 145, the dye recycling control shim 146 is not pressed and maintaining an original shape so that the dye recycling path 133 and the recycling path 137 are communicated with each other.

The cleaning-liquid control valve 140 is assembled to the base body 110, and the cleaning-liquid recycling control space 147 is formed between the cleaning-liquid control valve 140 and the base body 110. The cleaning-liquid recycling control shim 149 is located in the cleaning-liquid recycling control space 147, and the cleaning-liquid recycling control space 147 is divided into a first cleaning-liquid recycling control space 1471 and a second cleaning-liquid recycling control space 1472. The cleaning-liquid recycling control port 148 and the first cleaning-liquid recycling control space 1471 are communicated with each other. The cleaning-liquid recycling port 136 is located at an end of the cleaning-liquid recycling path 135, and an opposite end of the cleaning-liquid recycling path 135 is communicated to one of branches of the recycling path 137 through the second cleaning-liquid recycling control space 1472. When the control gas is injected into the first cleaning-liquid recycling control space 1471 through the cleaning-liquid recycling control port 148, the cleaning-liquid recycling control shim 149 is pressed and elastically deformed to block the branch of the recycling path 137 communicating to the second cleaning-liquid recycling control space 1472 so that the cleaning-liquid recycling path 135 and the recycling path 137 are not communicated with each other. When the control gas is not injected into the first cleaning-liquid recycling control space through the cleaning-liquid recycling control space 148, the cleaning-liquid recycling control shim 149 is not pressed and maintaining an original shape so that the cleaning-liquid recycling path 135 and the recycling path 137 are communicated with each other.

The multi-way control valve 10 is configured to changeable among a first communicating state, a second communicating state, and a third communicating state. When the multi-way control valve 10 is at the first communicating state, the control gas is injected into all of the control ports except the dye injection control port 125 and the dye recycling control port 145 so that only the dye injection path 113 is communicated to the injection path 117, and the dye recycling path 133 is communicated to the recycling path 137 in the base body 110 of the multi-way control valve 10. When the multi-way control valve 10 is at the second communicating state, the control gas is injected into all of the control ports except the cleaning-liquid injection control port 128 and the cleaning-liquid recycling control space 148 so that only the cleaning-liquid injection path 115 is communicated to the injection path 117, and the cleaning-liquid recycling path 135 is communicated to the recycling path 137 in the base body 110 of the multi-way control valve 10. When the multi-way control valve 10 is at the third communicating state, the control gas is injected into all of the control ports except the gas injection control port 122 and the gas recycling control port 142 so that only the gas injection path 111 is communicated to the injection path 117, and the gas recycling path 131 is communicated to the recycling path 137 in the base body 110 of the multi-way control valve 10.

Figure 7:
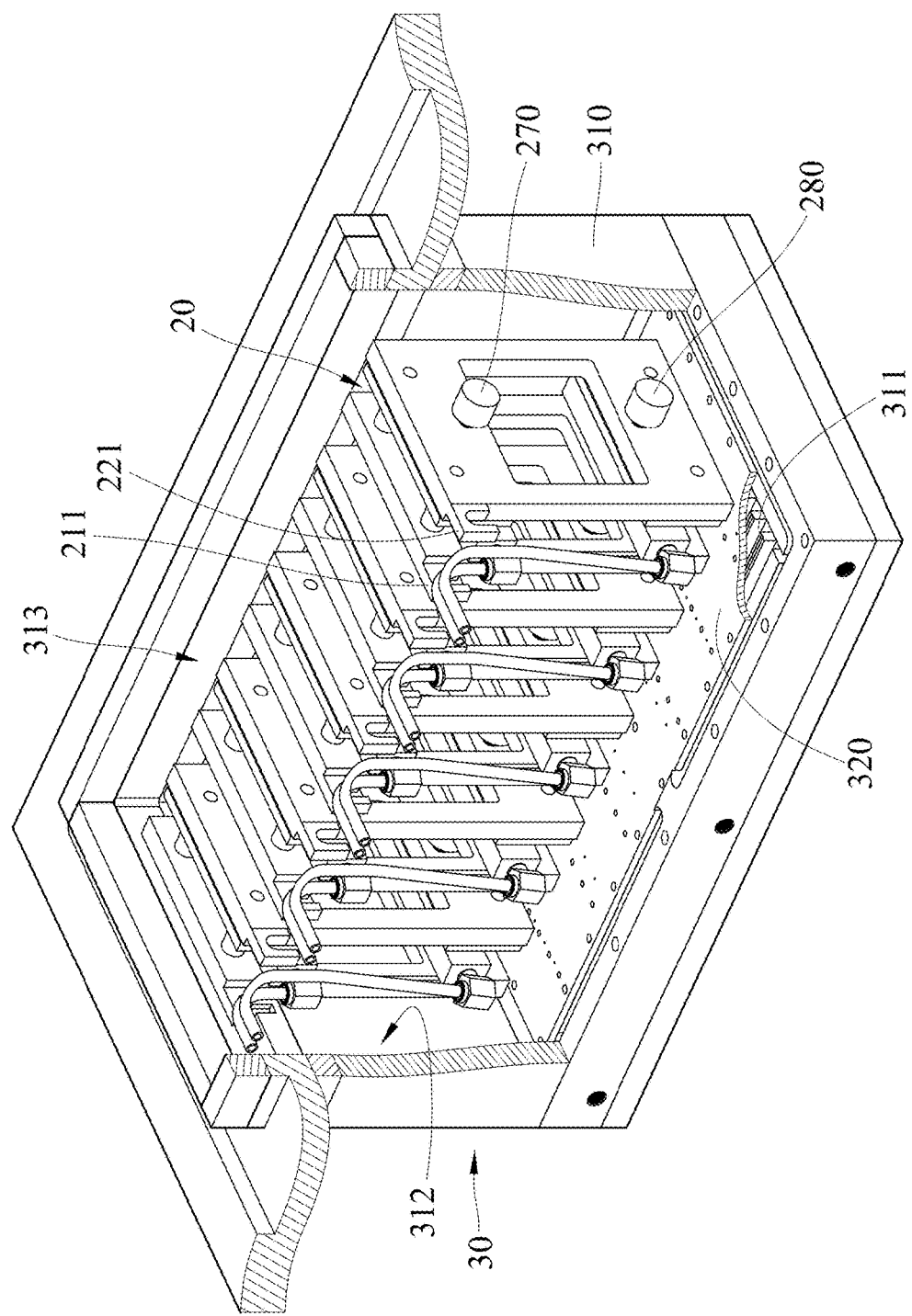
FIG. 7 is a partial cross-sectional view of an electrode jig and an electrode temperature control module in a dye-adsorption apparatus according to an embodiment of the disclosure.
Figure 8:
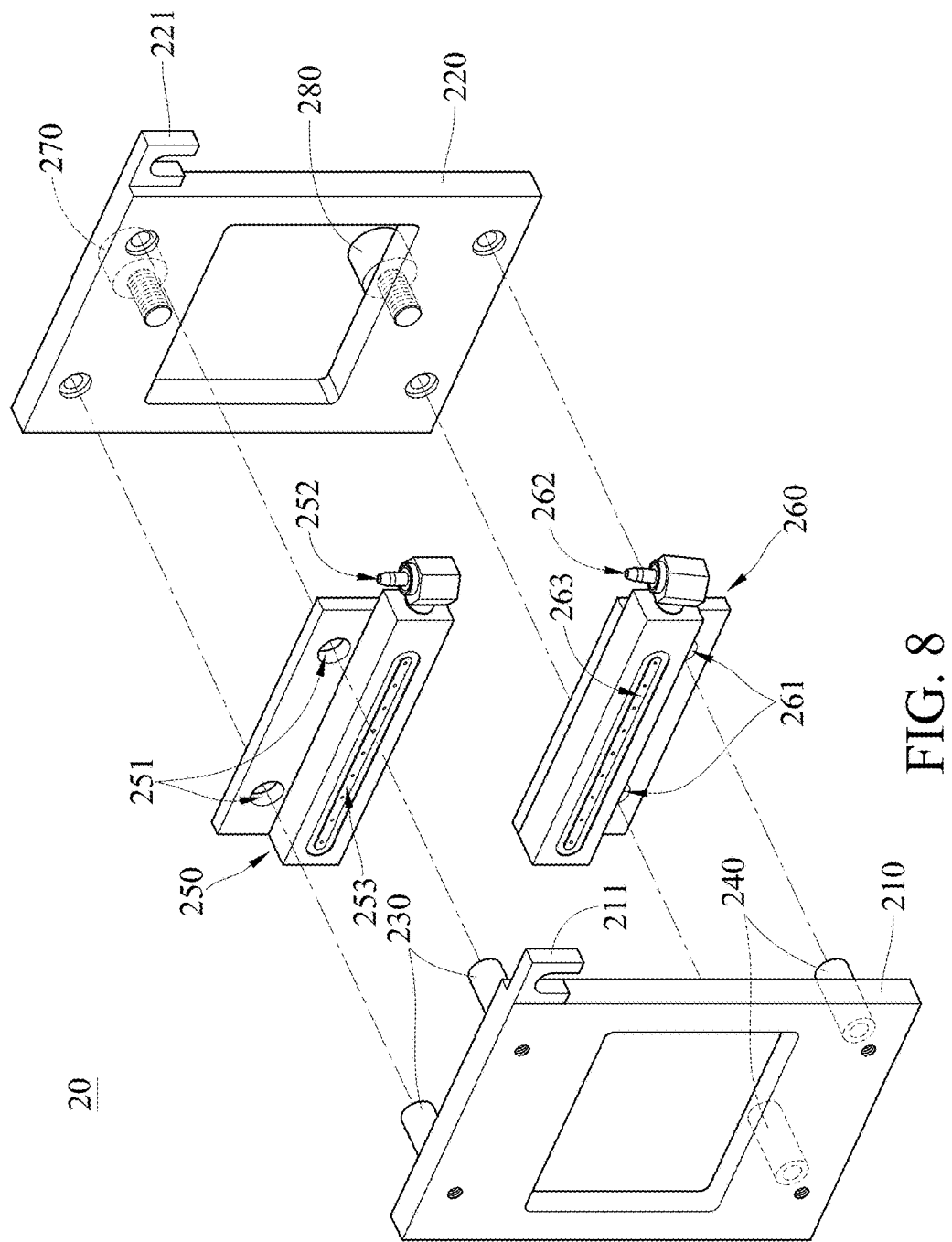
FIG. 8 is an exploded view of an electrode jig in a dye-adsorption apparatus according to an embodiment of the disclosure.

Next, the electrode jig 20 and the electrode temperature control module 30 are illustrated in the following paragraphs. Please refer to FIG. 2A, FIG. 7, and FIG. 8. FIG. 7 is a partial cross-sectional view of an electrode jig and an electrode temperature control module in a dye-adsorption apparatus according to an embodiment of the disclosure. FIG. 8 is an exploded view of an electrode jig in a dye-adsorption apparatus according to an embodiment of the disclosure.

The electrode jig 20 includes a first plate 210, a second plate 220, two first guiding columns 230, two second guiding columns 240, a first clamp block 250, a second clamp block 260, a first adjustment screw 270, and a second adjustment screw 280. The first plate 210 has a first hook 211 located at a side of the first plate 210. The second plate 220 has a second hook 221 located at a side of the second plate 220. The location of the first hook 211 is corresponding to the second hook 221, which means an orthogonal projection of the first hook 211 on the second plate 220 and the second hook 221 are overlapped with each other. The first clamp block 250 located between the first plate 210 and the second plate 220, and the first clamp block 250 is close to the first hook 211 and the second hook 221. The first clamp block 250 has two first through holes 251, two first guiding columns 230 crossing the two first through holes 251, respectively, and the first plate 210 and the second plate 220 are connected by the two first guiding columns 230 so that the first clamp block 250 is slidable between the first plate 210 and the second plate 220 along the two first guiding columns 230. The second clamp block 260 located between the first plate 210 and the second plate 220, and the first clamp block 250 is away from the first hook 211 and the second hook 221. The second clamp block 260 has two second through hole 261, two second guiding columns 240 crossing the two second through holes 261, respectively, and the first plate 210 and the second plate 220 are connected by the two second guiding columns 240 so that the second clamp block 260 is slidable between the first plate 210 and the second plate 220 along the two second guiding columns 240.

The first adjustment screw 270 is installed at a side of the second plate 220 close to the second hook 221 and crosses the second plate 220. A terminal end of the first adjustment screw 270 abuts against the first clamp block 250 for adjusting a distance between the first clamp block 250 and the first plate 210. The second adjustment screw 280 is installed at a side of the second plate 220 away from the second hook 221 and crosses the second plate 220. A terminal end of the second adjustment screw 280 abuts against the second clamp block 260 for adjusting a distance between the second clamp block 260 and the first plate 210.

The first clamp block 250 further has a jig outlet 252 and a recycling port 253 of the electrode jig 20. The jig outlet 252 and the recycling port 253 of the electrode jig 20 are communicated with each other through a pipeline in the first clamp block 250. The second clamp block 260 further has a jig inlet 262 and an injection port 263 of the electrode jig 20. The jig inlet 262 and the injection port 263 of the electrode jig 20 are communicated with each other through a pipeline in the second clamp block 260. Before injecting the dye into the space between the two electrodes, the two electrodes are disposed between the first plate 210 and the second plate 220, and then the first adjustment screw 270 and the second adjustment screw 280 are adjusted for clamping the two electrodes with the first clamp block 250, the second clamp block 260, and the first plate. The recycling port 253 of the electrode jig 20 in the first clamp block 250 corresponds to the electrode outlet. The injection port 263 of the electrode jig 20 of the second clamp block 260 corresponds to the electrode inlet. Specifically, the recycling port 253 of the electrode jig 20 and the electrode outlet are communicated with each other, and the injection port 263 of the electrode jig 20 and the electrode inlet are communicated with each other. As a result, a fluid can enter the electrode jig 20 from the jig inlet on the second clamp block 260, and then the fluid can flow into the space between the two electrodes through the injection port 263 of the electrode jig 20 and the electrode inlet in sequence, and then the fluid leaves the electrode jig 20 through the electrode outlet, the recycling port 253 of the electrode jig 20 on the first clamp block 250 and the jig outlet 252 in sequence.

The electrode temperature control module 30 includes a heating tank 310, a heating plate 320, an in-tank frame 330, an outer frame 340, and a cover 350. The heating tank 310 is assembled on the supporting surface 910 of the main body 90. The heating plate 320 is located on bottom surface 311 of the heating tank. The in-tank frame 330 is located at the wall surface 312 of the heating tank 310, and the in-tank frame 330 is located between the supporting surface 910 and the bottom surface 311. The outer frame 340 is located on the top of the wall surface 312 and extends away from the bottom surface 311. The cover 350 is pivoted on the wall surface 312, and the cover 350 can rotate relative to the heating tank 310. When the cover 350 covers the tank opening 313 of the heating tank 310, the thermal insulation effect of the heating tank 310 can be improved.

When the user installs the electrodes at the electrode jig 20 or removes the electrode from the electrode jig 20, the electrode jig 20 can be hanged on the outer frame 340 by the first hook 211 and the second hook 221 so that the electrode jig 20 is located outside of the heating tank; therefore, the user can have more operation space for installing the electrode at the electrode jig 20 or removes the electrode from the electrode jig 20. When the electrodes adsorb the dye by injecting the dye into the space between the two electrodes, the electrode jig 20 can be hanged on the in-tank frame 330 by the first hook 211 and the second hook 221 so that the electrode jig 20 can be located in the heating tank 310 with a temperature higher than the room temperature; therefore, the rate of forming the chemical bonds between the dye and the porous structure is increased, which means the dye-adsorption rate is increased.

Figure 9:
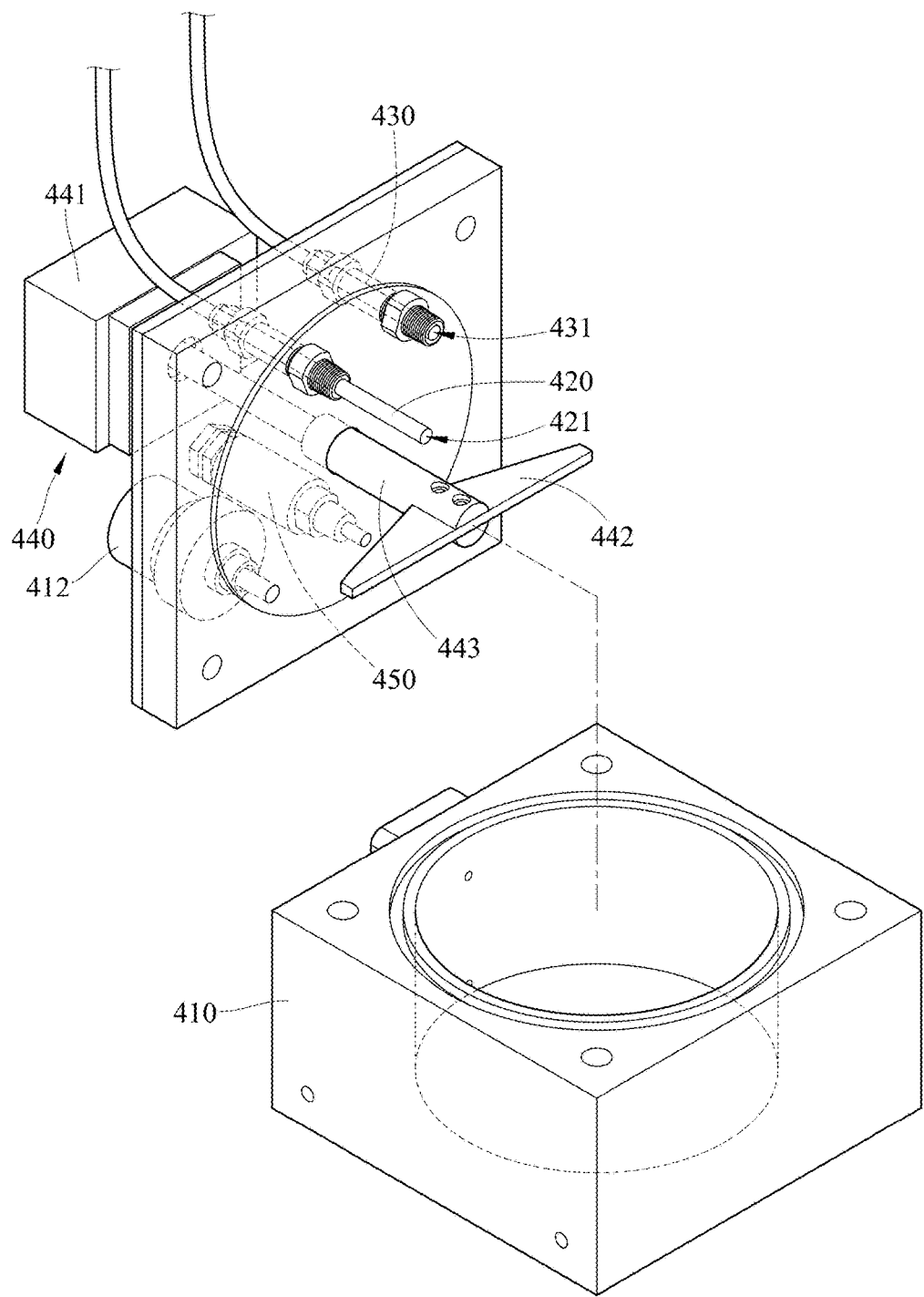
FIG. 9 is an exploded view of a dye container in a dye-adsorption apparatus according to an embodiment of the disclosure.

Next, the dye container 40 is illustrated in the following paragraphs. Please refer to FIG. 2B and FIG. 9. FIG. 9 is an exploded view of a dye container in a dye-adsorption apparatus according to an embodiment of the disclosure.

The dye container 40 includes a dye tank 410, a dye outlet pipe 420, a dye inlet pipe 430, a blender 440, and a pressure relief valve 450. The dye tank 410 is installed at the side surface 920 of the main body 90. The dye tank 410 has a dye container observing window 411 and a dye sampling port 412. The dye container observing window 411 is configured to observe the liquid level of the dye in the dye tank 410 for confirming the stock of the dye. The dye sampling port 412 is configured to take a few amount of the dye from the dye tank 410 to check the quality of the dye in the dye tank 410.

The dye outlet pipe 420 is located at the dye tank 410, and the dye outlet 421 is located on the dye outlet pipe 420. A first end of the dye outlet pipe 420 is opened in the dye tank 410 and coverable by the dye in the dye tank 410, and a second end of the dye outlet pipe 420 opposite to the first end is opened outside of the dye tank 410 and communicated with the dye injection port 114 of the multi-way control valve 10 through the non-metal pipe. The dye inlet pipe 430 is located at the dye tank 410, and the dye inlet 431 is located on the dye inlet pipe 430. A third end of the dye inlet pipe 430 is opened in the dye tank 410 and keeps a distance from the dye, and a fourth end of the dye inlet pipe opposite to the third end is opened outside of the dye tank 410 and communicated with the dye recycling port 134 of the multi-way control valve 10 through the non-metal pipe.

A motor 441 of the blender 440 is located outside of the dye tank 410. The stirring head 442 of the blender 440 is located in the dye tank 410 and immersed in the dye. The motor 441 is connected to the stirring head 442 through the rotary shaft 443. The pressure relief valve 450 of the dye container 40 is located at the dye tank 410. The pressure relief valve 450 of the dye container is configured to adjust the pressure in the dye tank 410 so as to control the pressure in the dye tank 410.

Figure 10:
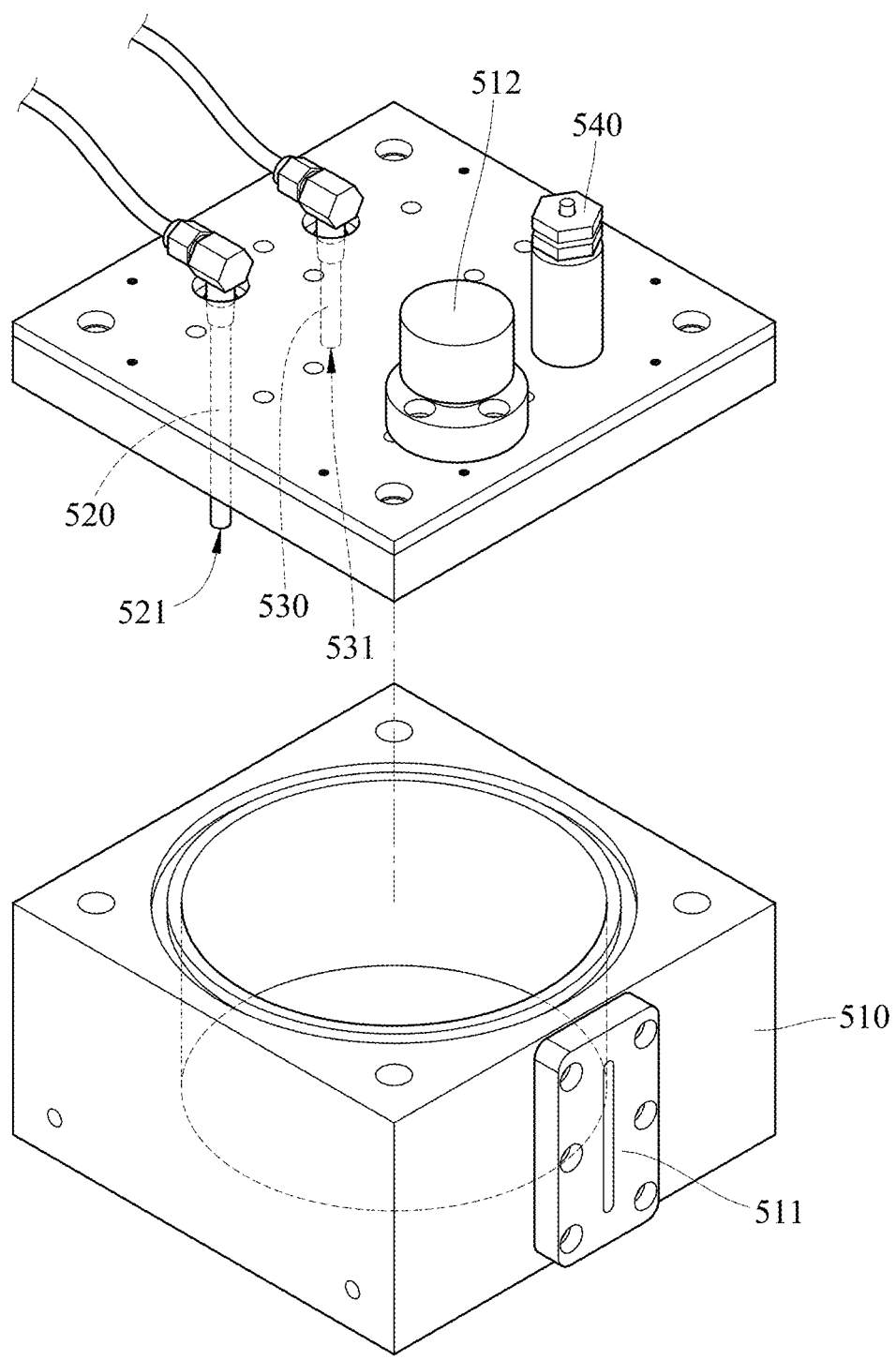
FIG. 10 is an exploded view of a cleaning-liquid container in a dye-adsorption apparatus according to an embodiment of the disclosure.

Next, the cleaning-liquid container 50 is illustrated in the following paragraphs. Please refer to FIG. 2A and FIG. 10. FIG. 10 is an exploded view of a cleaning-liquid container in a dye-adsorption apparatus according to an embodiment of the disclosure.

The cleaning-liquid container 50 includes a cleaning-liquid tank 510, a cleaning-liquid outlet pipe 520, a cleaning-liquid inlet pipe 530, and a pressure relief valve 540. The cleaning-liquid tank 510 is installed at the side surface 920 of the main body 90. The cleaning-liquid tank 510 has a cleaning-liquid container observing window 511 and a cleaning-liquid sampling port 512. The cleaning-liquid container observing window 511 is configured to observe the liquid level of the cleaning-liquid in the cleaning-liquid tank 510 for confirming the stock of the cleaning-liquid. The cleaning-liquid sampling port 512 is configured to take a few cleaning-liquid from the cleaning-liquid tank 510 to check the quality of the cleaning-liquid in the cleaning-liquid tank 510.

The cleaning-liquid outlet pipe 520 is located at the cleaning-liquid tank 510, and the cleaning-liquid outlet 521 is located on the cleaning-liquid outlet pipe 520. A first end of the cleaning-liquid outlet pipe 520 is opened in the cleaning-liquid tank 510 and coverable by the cleaning-liquid in the cleaning-liquid tank 510, and a second end of the cleaning-liquid outlet pipe 520 opposite to the first end is opened outside of the cleaning-liquid tank 510 and communicated with the cleaning-liquid injection port 116 of the multi-way control valve 10 through the non-metal pipe. The cleaning-liquid inlet pipe 530 is located at the cleaning-liquid tank 510, and the cleaning-liquid inlet 531 is located on the cleaning-liquid inlet pipe 530. A third end of the cleaning-liquid inlet pipe 530 is opened in the cleaning-liquid tank 510 and keeps a distance from the cleaning-liquid, and a fourth end of the cleaning-liquid inlet pipe 530 opposite to the third end is opened outside of the cleaning-liquid tank 510 and communicated with the cleaning-liquid recycling port 136 of the multi-way control valve 10 through the non-metal pipe.

The pressure relief valve 540 of the cleaning-liquid container 50 is located at the cleaning-liquid tank 510. The pressure relief valve 540 of the cleaning-liquid container is configured to adjust the pressure in the cleaning-liquid tank 510 so as to control the pressure in the cleaning-liquid tank 510.

Next, the gas supply module 60 is illustrated in the following paragraphs. Please refer to FIG. 2A to FIG. 4. The gas supply module 60 includes a gas source 610 and a vent 620. The gas source 610 is communicated to the gas injection port 112 of the multi-way control valve 10 through the non-metal pipe. The gas source 610 provides the gas such as the nitrogen and the inert gas. The vent 620 is communicated to the gas recycling port 132 of the multi-way control valve 10 through the non-metal pipe, and the vent 620 is also communicated with an inlet of an air-extracting pump (not shown). As a result, air-extracting pump (not shown) can maintain the non-metal pipe and the space between the two electrodes at a vacuum state.

Next, the fluid transmitting module 70 is illustrated in the following paragraphs. Please refer to FIG. 2A to FIG. 4. The fluid transmitting module 70 includes a liquid-driving pump 710, a first pipe joint 720, a second pipe joint 730 and a pressure detector 740. The liquid-driving pump 710, the first pipe joint 720, the second pipe joint 730 and the pressure detector 740 are installed on the supporting surface 910 of the main body 90.

The liquid-driving pump 710 is configured to drive the fluid to flow among the dye container 40 or the cleaning-liquid container 50, the injection port 118, the space between the two electrodes, and the recycling port 138. In this embodiment of the disclosure, the liquid-driving pump 710 is a peristaltic pump. One of the advantages of the peristaltic pump is the precise flow control which can help to control the force pushing the dye to move toward the porous structure on the electrode surface.

The first pipe joint 720 is configured for dividing the fluid in the non-metal pipe communicating to the injection port 118 into multiple non-metal pipes which communicating to multiple of the electrode jigs 20, respectively. The number of the non-metal pipes communicating to the electrode jigs 20 is equal to the number of the electrode jigs 20. The second pipe joint 730 has two functions. The first function of the second pipe joint 730 is communicating the multiple non-metal pipes away from the first pipe joint 720 to the multiple non-metal pipes which are communicated to the multiple jig inlets 262 of the multiple electrode jigs 20, respectively. The second function of the second pipe joint 730 is combining the multiple non-metal pipes which are communicated to the multiple jig outlets 252 of the multiple electrode jigs 20 and the non-metal pipe communicated to the pressure detector 740 into one non-metal pipe communicated to the recycling port 138 of the multi-way control valve 10. The pressure detector 740 is configured to detect the fluid pressure in the non-metal pipe. When the gas is injected into the non-metal pipe from the gas source 610 of the gas supply module 60, if the pressure detector 740 detects abnormal pressure variation in the non-metal pipe, the pressure detector 740 can determine there is a leakage situation on the non-metal pipe and notify the controller 80 to abort the operation of the dye-adsorption apparatus 1 so as to avoid the leakage of the dye or the cleaning-liquid from the non-metal pipe. In this embodiment, the location where the liquid-driving pump 710 drives the fluid is between the first pipe joint 720 and the second pipe joint 730. Specifically, the location where the liquid-driving pump 710 provides the kinetic energy to the fluid in the non-metal pipe between the first pipe joint 720 and the second pipe joint 730. In this embodiment, the fluid is transmitted by the non-metal pipe, but the disclosure is not limited thereto. In other embodiments of the disclosure, the fluid can be transmitted by the anti-corrosion metal pipe or the metal-pipe coated by anti-corrosion layer to protect the pipe from corrosion.

Next, the controller 80 is illustrated in the following paragraphs. Please refer to FIG. 2A to FIG. 4. The controller 80 is installed on the side surface 920 of the main body 90. The controller 80 can be configured to help the user to control the multi-way control valve 10 alternately among the first communicating state, the second communicating state, and the third communicating state so as to control whether the gas, the dye or the cleaning-liquid is injected into the injection path 117 and flowed out from the injection port 118 and control whether the gas, the dye, or the cleaning-liquid is flow into the gas recycling path 131, the dye recycling path 133, or the cleaning-liquid recycling path 135 from the recycling path 137. Moreover, the controller 80 can also be configured to control the temperature in the heating tank 310 of the electrode temperature control module 30 and the blending speed of the blender 440 in the dye container 40.

Moreover, the controller 80 can also be configured to control the rotation speed of the liquid-driving pump 710 so as to control the amount of the fluid flowing through the space between the two electrodes. In this embodiment, the user can control the communication state of the multi-way control valve 10, the temperature in the heating tank 310 of the electrode temperature control module 30, the blending speed of the blender 440, and the rotation speed of the liquid-driving pump 710 by the controller 80, but the disclosure is not limited thereto. In other embodiments of the disclosure, the user can directly control the communication state of the multi-way control valve, the temperature in the heating tank of the electrode temperature control module, the blending speed of the blender, and the rotation speed of the liquid-driving pump without the controller.

The following paragraphs illustrate the operation of the dye-adsorption apparatus in an embodiment of the disclosure by performing the dye-adsorption method in the disclosure to obtain several embodiments. The effect of the dye-adsorption method is also illustrated in the following paragraphs by comparing the embodiments of the disclosure and the comparative embodiment. Please refer to FIG. 11A to FIG. 11D. FIG. 11A to FIG. 11D are schematic views of a dye-adsorption apparatus of electrodes in different operation steps according to an embodiment of the disclosure. The manufacturing method of the two electrodes, which have not adsorbed the dye yet, in the following embodiments includes the steps bellow. First, dispose the platinum layer on a conductive glass and the porous structure on another conductive glass face to face. The conductive glasses are made of FTO. The porous structure is made of titanium dioxide double layers, and the porous structure has scattering function. A thermoplastic material is plated on the side edge of the conductive glasses to seal the platinum layer and the porous structure in the space between the two conductive glasses. The two electrodes structure is disposed and fixed at the electrode jig of the dye-adsorption apparatus. The electrode inlet and the electrode outlet of the two electrode structure are aligned and communicated to the jig inlet and the jig outlet of the electrode jig, respectively.

First Embodiment

Figure 11A:
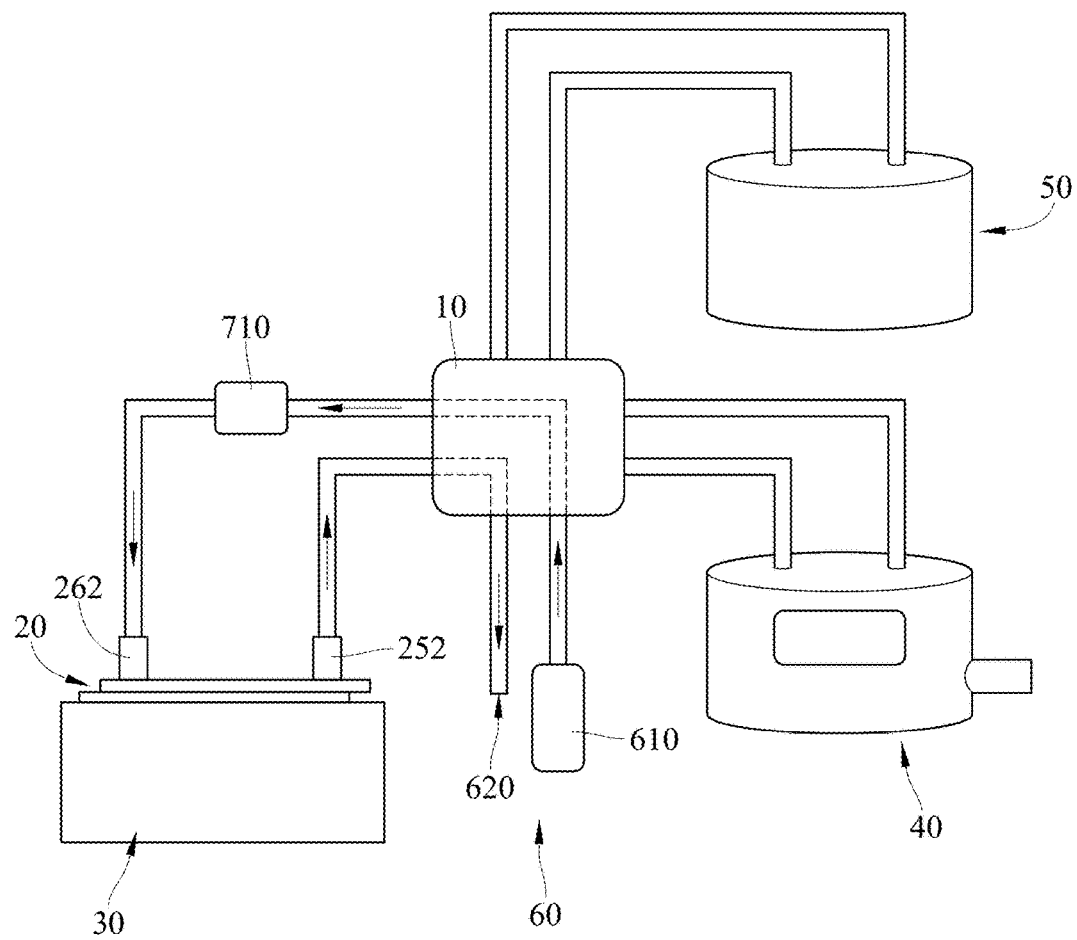
FIG. 11A to FIG. 11D are schematic views of a dye-adsorption apparatus of electrodes in different operation steps according to an embodiment of the disclosure.

First, perform the gas phase electrode-cleaning step. As shown in FIG. 11A, control the multi-way control valve 10 to be at the third communicating state so that the nitrogen from the gas source 610 of the gas supply module 60 flows along the non-metal pipe through the multi-way control valve 10, the peristaltic pump as the liquid-driving pump 710, the jig inlet 262 of the electrode jig 20, the space between the two electrodes, the jig outlet 252 of the electrode jig 20, and the multi-way control valve 10 in sequence, and then evacuated from the vent 620 of the gas supply module 60. After the nitrogen is injected into and flow through the space between the two electrodes, stop injecting the nitrogen, and then evacuate the space between the two electrodes to a vacuum state. The step of injecting nitrogen into the space between the two electrodes and the step of evacuating the space between the two electrodes to the vacuum state are performed alternately several times.

Figure 11B:
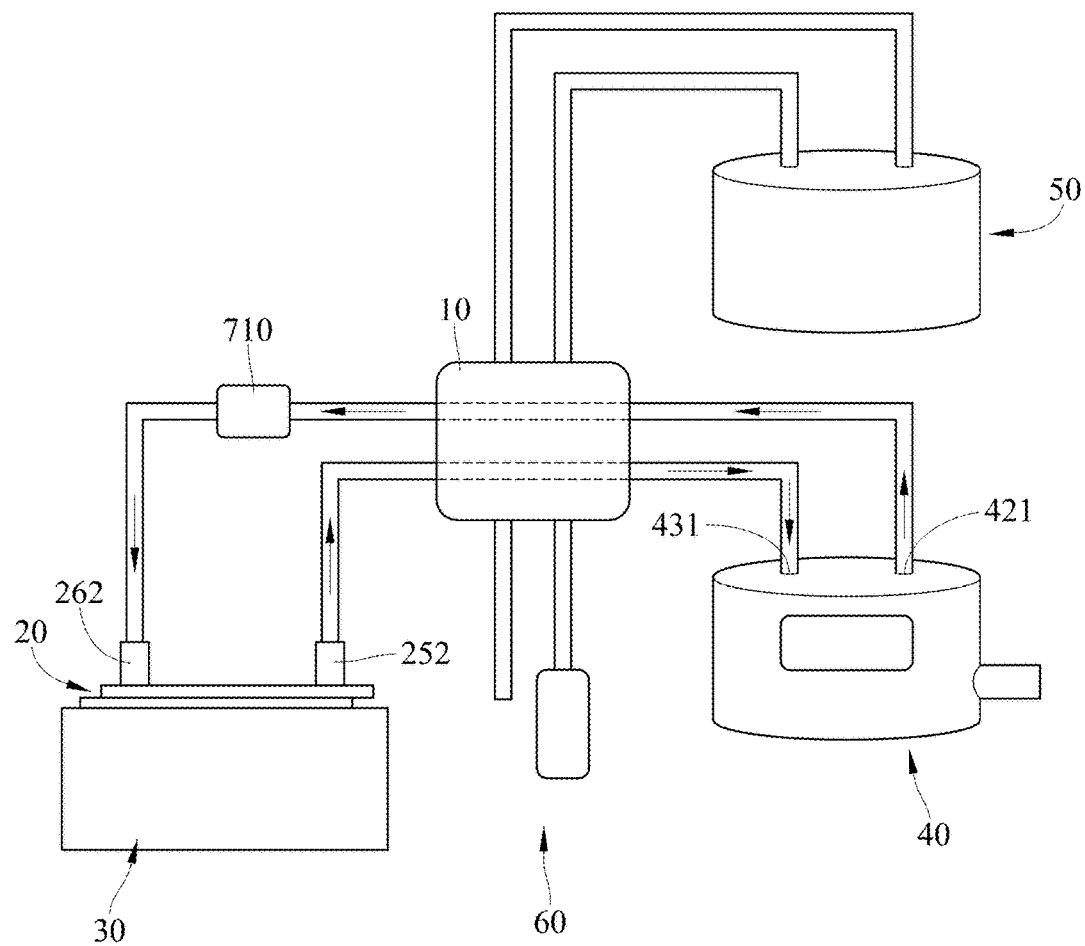

Next, perform the dye adsorption step. As shown in FIG. 11B, control the multi-way control valve 10 to be at the first communicating state so that the dye from the dye container 40 flows along the non-metal pipe through the multi-way control valve 10, the peristaltic pump as the liquid-driving pump 710, the jig inlet 262 of the electrode jig 20, the space between the two electrodes, the jig outlet 252 of the electrode jig 20, and the multi-way control valve 10 in sequence, and then flow back to the dye container 40 through the dye inlet 431. The dye is a dye solution of cis-diisothiocyanato-(2,2'-bipyridyl-4,4'-dicarboxylic acid)-(2,2'-bipyridyl-4,4'-dinonyl) ruthenium(II) (Z907)(Formula I) and chenodeoxycholic acid dissolved in acetonitrile and tetrabutylammonium hydroxide. When the dye adsorption step is performed, the temperature of the two electrodes is 25° C. The duration of the dye adsorption step is 24 hours. When the dye is injected into the space between the two electrodes, the peristaltic pump rotates forwardly so as to inject the dye into and flow through the space between the two electrodes. When recycle the dye back to the dye container 40 before the end of the dye adsorption step, the peristaltic pump rotates backwardly so that the air in the dye tank 410 are sucked into the dye inlet 431 and push the unadsorbed dye back to the dye container 40 through the dye outlet 421.

Formula I

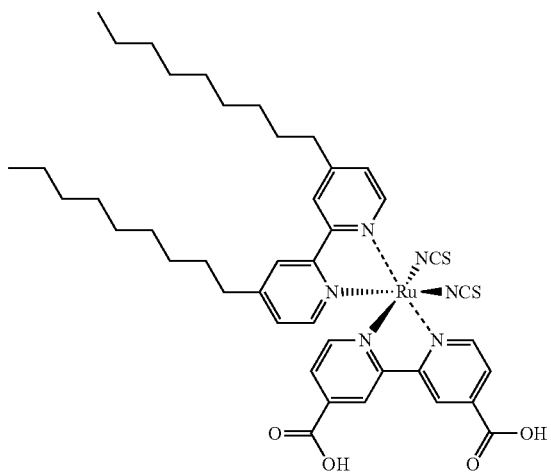

Figure 11C:
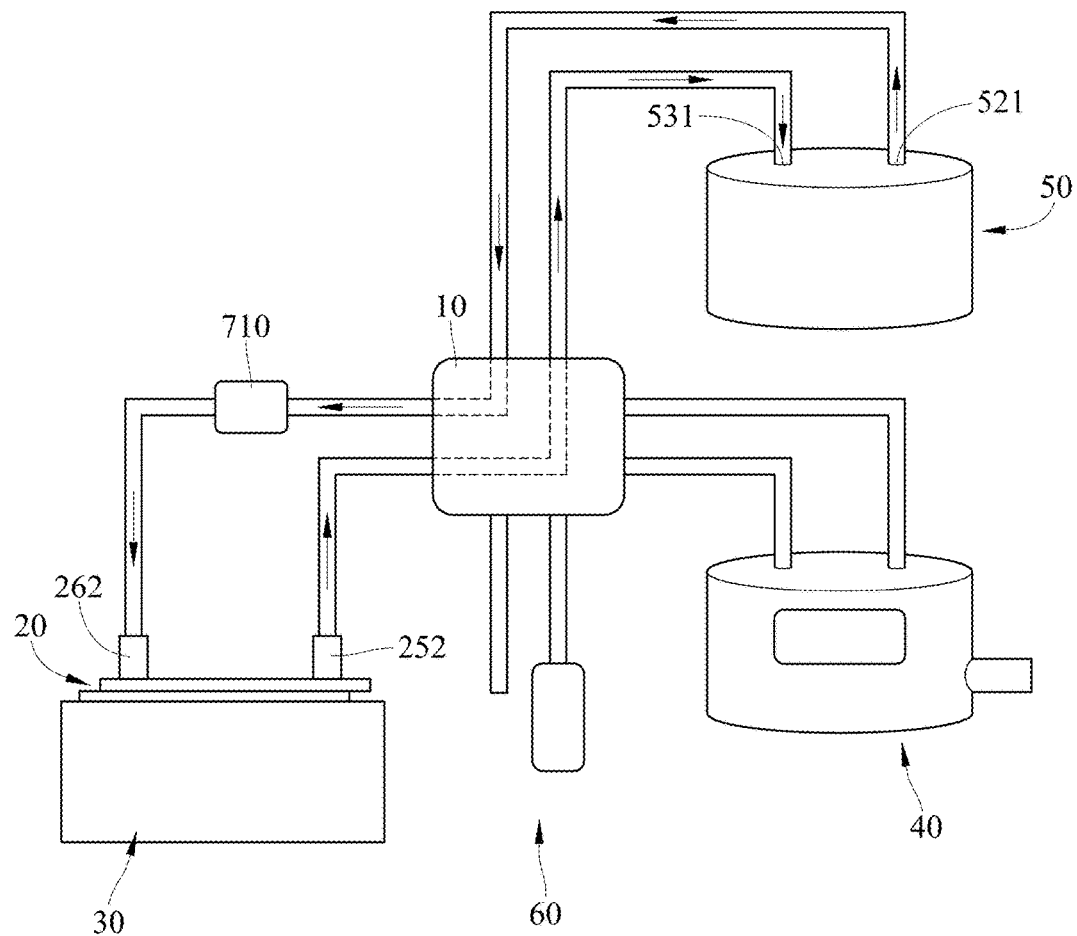

Next, perform the liquid phase electrode-cleaning step. As shown in FIG. 11C, control the multi-way control valve 10 to be at the second communicating state so that the cleaning-liquid from the cleaning-liquid container 50 flows along the non-metal pipe through the multi-way control valve 10, the peristaltic pump as the liquid-driving pump 710, the jig inlet 262 of the electrode jig 20, the space between the two electrodes, the jig outlet 252 of the electrode jig 20, and the multi-way control valve 10 in sequence, and then flow back to the cleaning-liquid container 50 through the cleaning-liquid inlet 531. When the cleaning-liquid is injected into the space between the two electrodes, the peristaltic pump rotates forwardly so as to inject the cleaning-liquid into and flow through the space between the two electrodes. When recycle the cleaning-liquid back to the cleaning-liquid container 50 before the end of the liquid phase electrode-cleaning step, the peristaltic pump rotates backwardly so that the air in the cleaning-liquid tank 510 are sucked into the cleaning-liquid inlet 531 and push the cleaning-liquid back to the cleaning-liquid container 50 through the cleaning-liquid outlet 521. The cleaning-liquid is acetonitrile.

Figure 11D:
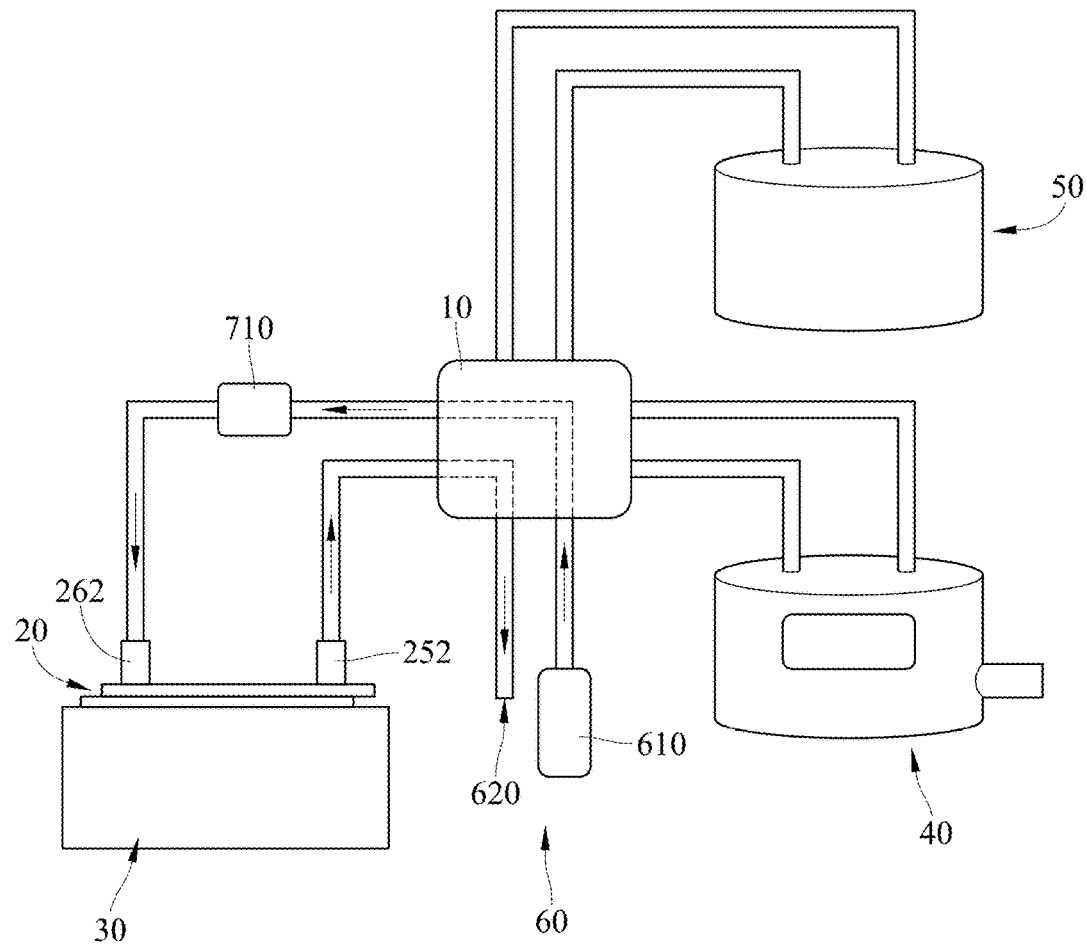

Next, perform the gas phase drying step. As shown in FIG. 11D, control the multi-way control valve 10 to be at the third communicating state so that the nitrogen from the gas source 610 of the gas supply module 60 flows along the non-metal pipe through the multi-way control valve 10, the peristaltic pump as the liquid-driving pump 710, the jig inlet 262 of the electrode jig 20, the space between the two electrodes, the jig outlet 252 of the electrode jig 20, and the multi-way control valve 10 in sequence, and then evacuated from the vent 620 of the gas supply module 60. After the nitrogen is injected into and flow through the space between the two electrodes, stop injecting the nitrogen, and then evacuate the space between the two electrodes to a vacuum state. The step of injecting nitrogen into the space between the two electrodes and the step of evacuating the space between the two electrodes to the vacuum state are performed alternately several times.

Second Embodiment

The dye-adsorption method in the second embodiment is similar to the dye-adsorption method in the first embodiment. The difference between the first embodiment and the second embodiment is that the five electrode jigs in the dye-adsorption apparatus performs the dye-adsorption method at the same time so that sample one to sample five are manufactured in batch.

Third Embodiment

The dye-adsorption method in the third embodiment is similar to the dye-adsorption method in the first embodiment. The difference between the first embodiment and the third embodiment is that the five electrode jigs in the dye-adsorption apparatus performs the dye-adsorption method at the same time, and the duration of the dye-adsorption step is shorten to 3 hours. Therefore, sample six to sample ten are manufactured in batch.

Fourth Embodiment

The dye-adsorption method in the fourth embodiment is similar to the dye-adsorption method in the first embodiment. The difference between the first embodiment and the fourth embodiment is that different dyes flowing through different electrode inlet and electrode outlet are adsorbed on the porous structures at different area on the conductive glass, respectively, in sequence so as to obtain the multicolor electrode structure.

First Comparative Embodiment

In the first comparative embodiment, the conductive glass coated by the structure in the previous embodiment adsorbs the dye by the conventional immersion method. Next, the dye-adsorbed electrode and the conductive glass coated by the platinum layer are disposed with the porous structure and the platinum layer facing each other. Next, a thermoplastic material is plated on the side edge of the conductive glasses to seal the platinum layer and the dye-adsorbed porous structure in the space between the two conductive glasses.

Second Comparative Embodiment

The dye-adsorption method in the second comparative embodiment is similar to the dye-adsorption method in the first comparative embodiment. The difference between the first comparative embodiment and the second comparative embodiment is that five electrodes are immersed in the dye container at the same time to adsorb the dye in the second comparative embodiment so as the manufacture sample A to sample E in batch.

To test the dye-adsorption result of all the samples in the first embodiment to the fourth embodiment and the first comparative embodiment to the second comparative embodiment, all the samples are assembled into solar cells by the same way to measure the electrical properties.

First, the electrolyte is filled into the space between the two electrodes of all the samples from the electrode inlet or the electrode outlet. Next, the electrode inlet and the electrode outlet are sealed by UV-curable material. The electrolyte is a solution formed by dissolving iodine ($I_2$) and 3-propyl-1-methylimidazolium iodide in N-methylbenzimidazole and 3-methoxypropionitrile. Next, perform the electrical property measurement of the solar cells assembled by the samples. The light source is Air Mass 1.5, which represents the illuminance on the ground is provided by the simulated solar source having an energy density of 1000 W/m$^2$. The temperature of the solar cells is 20° C. during the electrical property test. The test result are shown in table 1 to table 5 and FIG. 12 to FIG. 14B.

Figure 12:
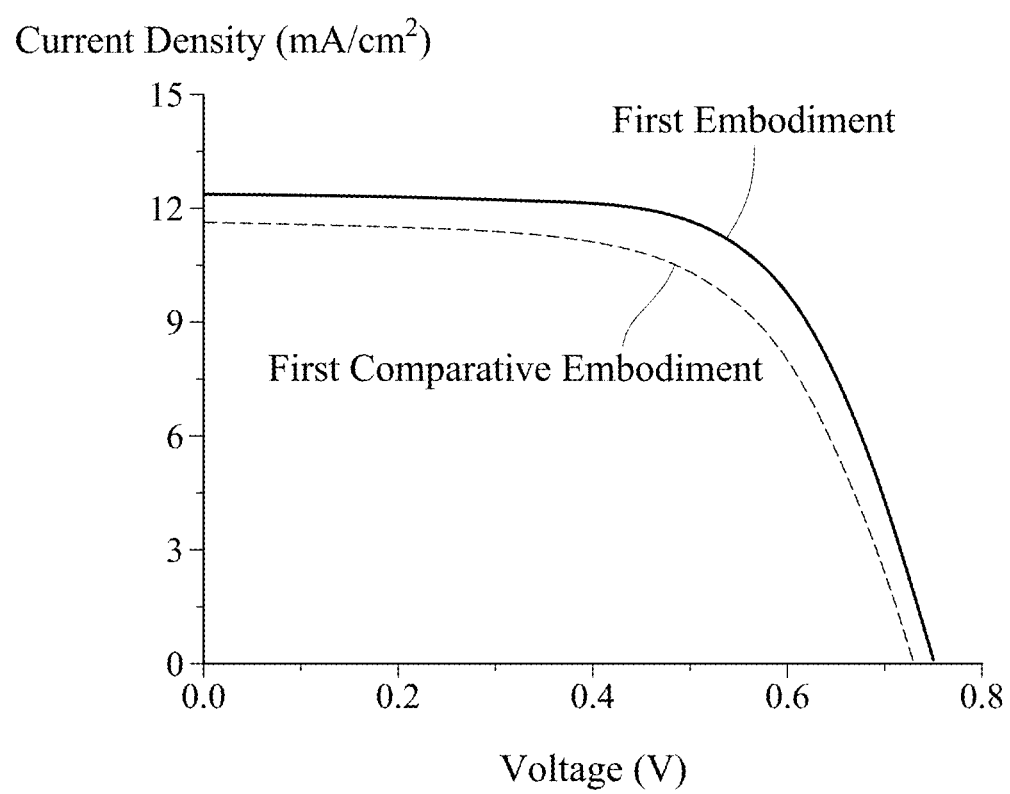
FIG. 12 is a voltage-current density curve of solar cells equipped with an electrode structure in a first embodiment of the disclosure and an electrode structure in a first comparative embodiment, respectively.
Figure 13A:
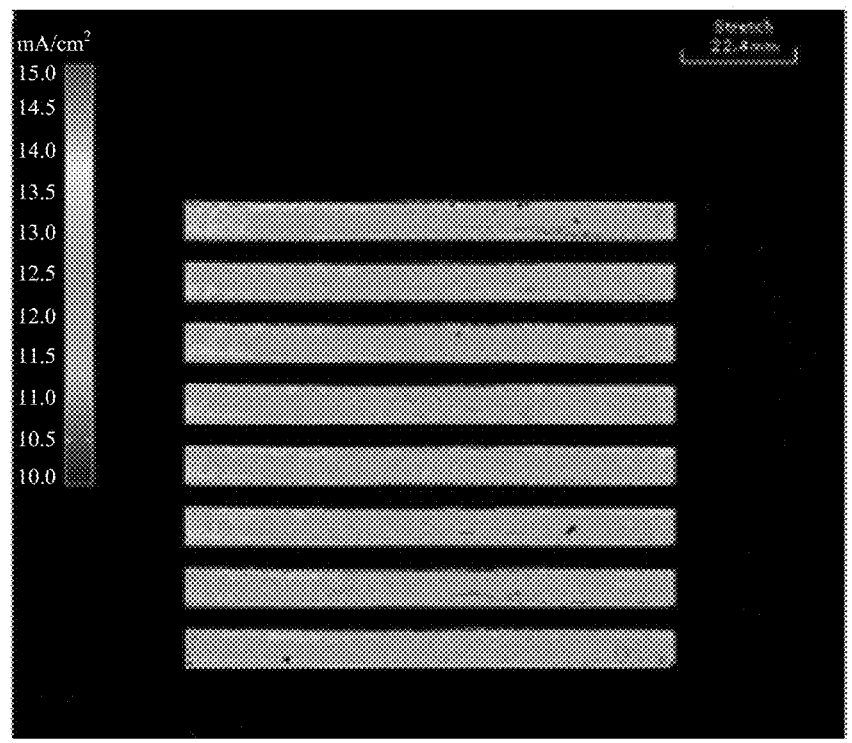
FIG. 13A is a current density distribution graph of a solar cell equipped with the electrode structure in the first embodiment of the disclosure.
Figure 13B:
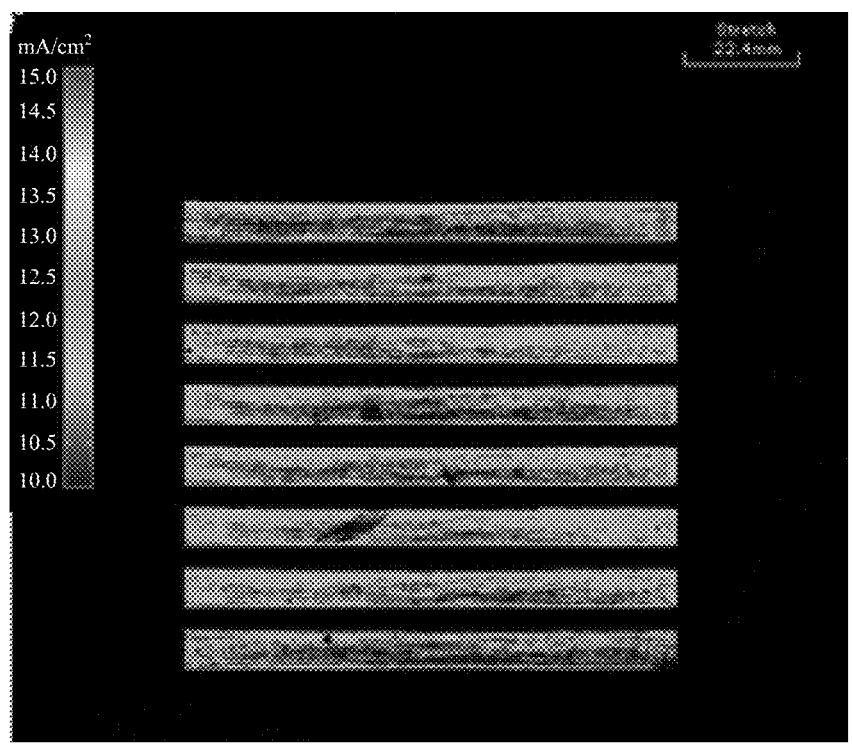
FIG. 13B is a current density distribution graph of a solar cell equipped with the electrode structure in the first comparative embodiment.

Table 1 is the test result of the solar cells with the electrode structure in the first embodiment and the first comparative embodiment. FIG. 12 is a voltage-current density curve of solar cells equipped with an electrode structure in a first embodiment of the disclosure and an electrode structure in a first comparative embodiment, respectively. FIG. 13A is a current density distribution graph of a solar cell equipped with the electrode structure in the first embodiment of the disclosure. FIG. 13B is a current density distribution graph of a solar cell equipped with the electrode structure in the first comparative embodiment.

TABLE 1

| | Open Circuit Voltage (V) | Short Circuit Current Density (mA/cm$^2$) | Fill Factor | Solar Cell Efficiency (%) |
|---|---|---|---|---|
| First Embodiment | 0.750 | 12.36 | 0.655 | 6.067 |
| First Comparative Embodiment | 0.730 | 11.63 | 0.618 | 5.239 |

In the first embodiment, the dye is injected into the space between the two electrodes and flow through the space so that the dye is adsorbed on the porous structure on the surface of the electrode The dye filled in the space is pushed by the following injected dye to enter the pores of the porous structure, and the pushing force applied on the dye also help the dye to overcome an interference caused by a surface tension which interferes the dye enter the small pores; therefore, the total surface area which adsorbs the dye is improved, and the dye can be uniformly distributed in the pores with different radius. However, as the dye adsorption is performed by the conventional immersion method, the dye enters the porous structure on the electrode by diffusion and capillarity so that the adsorption speed is slow, and the dye has difficulty to be distributed in the pores with different radius; therefore, the total surface area which adsorbs the dye is low. Accordingly, as shown in FIG. 12 and table 1, the solar cell with the electrode structure of the first embodiment has higher open circuit voltage, higher short circuit current density, higher fill factor, and higher solar cell efficiency than the solar cell with the electrode structure of the first comparative embodiment. Moreover, as shown in FIG. 13A and FIG. 13B, the current density distribution in the solar cell with the electrode structure of the first embodiment is more uniform than the current density distribution in the solar cell with the electrode structure of the first comparative embodiment; therefore, the electrode manufactured by the dye-adsorption method in the first embodiment of the disclosure has good dye-adsorption uniformity can be proved.

Table 2 shows the test result of the solar cells with the electrodes of sample 1 to sample 5 in the second embodiment and sample A to sample E in the second comparative embodiment.

TABLE 2

| | | Open Circuit Voltage (V) | Short Circuit Current Density (mA/cm$^2$) | Fill Factor | Solar Cell Efficiency (%) |
|---|---|---|---|---|---|
| Second Embodiment | Sample 1 | 0.764 | 12.05 | 0.650 | 5.984 |
| | Sample 2 | 0.762 | 11.69 | 0.668 | 5.952 |
| | Sample 3 | 0.767 | 11.76 | 0.671 | 6.050 |
| | Sample 4 | 0.766 | 11.65 | 0.668 | 5.962 |
| | Sample 5 | 0.763 | 11.73 | 0.668 | 5.977 |
| | Deviation (%) | 0.6 | 3.4 | 3.2 | 1.6 |
| Second Comparative Embodiment | Sample A | 0.748 | 10.71 | 0.668 | 5.349 |
| | Sample B | 0.751 | 10.86 | 0.689 | 5.614 |
| | Sample C | 0.735 | 11.25 | 0.681 | 5.317 |
| | Sample D | 0.745 | 10.87 | 0.676 | 5.476 |
| | Sample E | 0.748 | 10.64 | 0.667 | 5.304 |
| | Deviation (%) | 2.0 | 5.6 | 3.2 | 5.8 |

Sample 1 to sample 5 are electrodes manufactured in batch by the dye-adsorption apparatus with the dye-adsorption method in the second embodiment of the disclosure. Sample A to sample E are electrodes manufactured in batch by the dye container with the conventional immersion method in the second comparative embodiment. As shown in table 2, the solar cell with the electrode structure manufactured in batch by the dye-adsorption apparatus with the dye-adsorption method in the second embodiment has smaller open circuit voltage deviation, smaller short circuit current density deviation, smaller fill factor deviation, and smaller solar cell efficiency deviation than the solar cell with the electrodes manufactured in batch by the dye container with the conventional immersion method in the second comparative embodiment. Accordingly, the dye-adsorption apparatus and the dye-adsorption method in the disclosure can improve the stability of the dye-adsorption of the electrode.

Table 3 shows the test result of the solar cells with the electrodes of sample 6 to sample 10 in the third embodiment.

TABLE 3

| | | Open Circuit Voltage (V) | Short Circuit Current Density (mA/cm$^2$) | Fill Factor | Solar Cell Efficiency (%) |
|---|---|---|---|---|---|
| Third Embodiment | Sample 6 | 0.731 | 12.38 | 0.670 | 6.063 |
| | Sample 7 | 0.727 | 12.09 | 0.653 | 5.740 |
| | Sample 8 | 0.731 | 12.17 | 0.660 | 5.870 |
| | Sample 9 | 0.721 | 12.23 | 0.657 | 5.798 |
| | Sample 10 | 0.730 | 12.29 | 0.664 | 5.951 |
| | Deviation (%) | 1.4 | 2.4 | 2.6 | 5.5 |

Sample 6 to sample 10 are electrodes manufactured in batch by the dye-adsorption apparatus with the dye-adsorption method in the third embodiment of the disclosure. The duration of the dye-adsorption step in the third embodiment is shorter than the duration of the dye-adsorption step in the second embodiment. As shown in table 2 and table 3, the test results of the solar cell with the electrode structure in the third embodiment are similar to the test results of the solar cell with the electrode structure in the second embodiment. Accordingly, the dye-adsorption apparatus and the dye-adsorption method in the disclosure can shorten the duration of the dye-adsorption process.

Figure 14A:
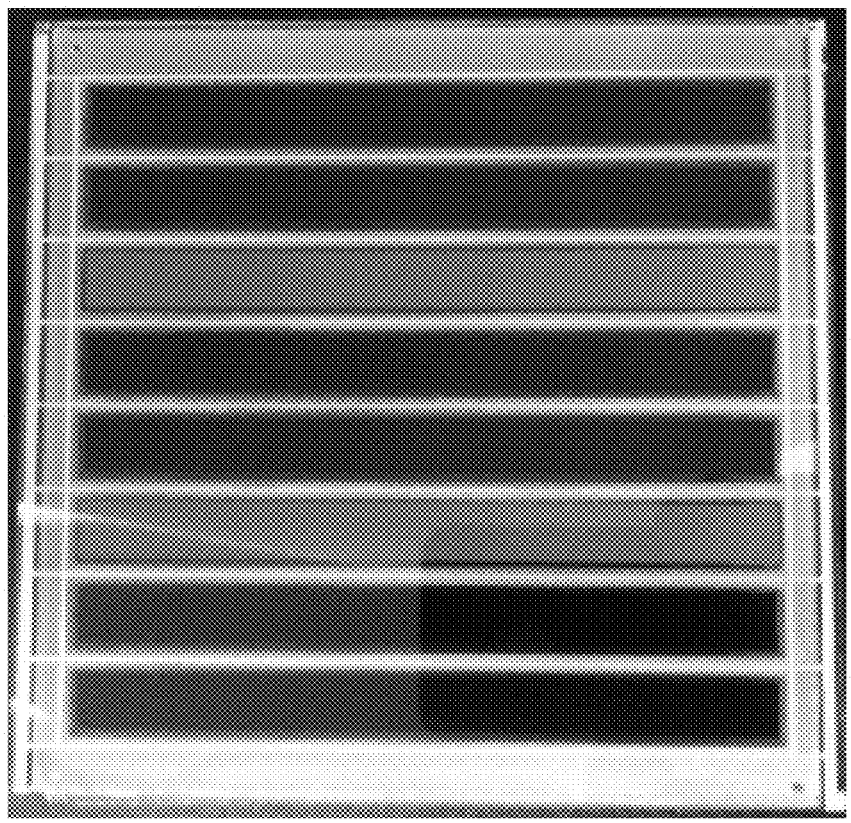
FIG. 14A is a photo of a multicolor electrode structure in a fourth embodiment of the disclosure.
Figure 14B:
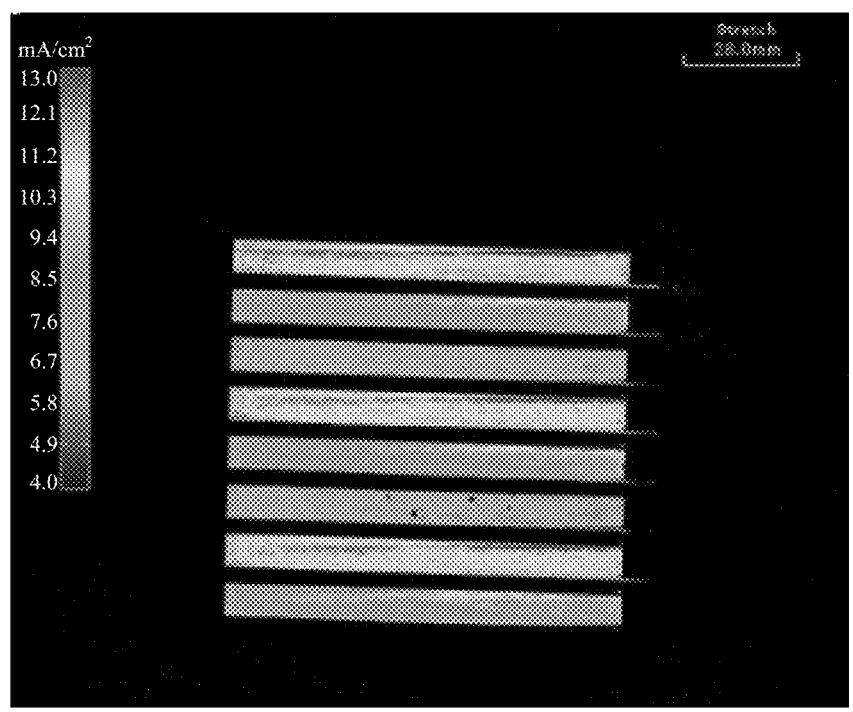
FIG. 14B is a current density distribution graph of a solar cell equipped with the multicolor electrode structure in the fourth embodiment of the disclosure.

Table 4 shows the test result of the solar cells with the electrode of the fourth embodiment. FIG. 14A is a photo of a multicolor electrode structure in a fourth embodiment of the disclosure. FIG. 14B is a current density distribution graph of a solar cell equipped with the multicolor electrode structure in the fourth embodiment of the disclosure.

TABLE 4

| | Open Circuit Voltage (V) | Short Circuit Current Density (mA/cm$^2$) | Fill Factor | Solar Cell Efficiency (%) |
|---|---|---|---|---|
| Fourth Embodiment | 0.746 | 9.305 | 0.646 | 4.484 |

In the manufacturing process of the multicolor electrode in the fourth embodiment, the different dyes flowing through different electrode inlet and electrode outlet are adsorbed on the porous structures at different area on the conductive glass, respectively, in sequence so as to obtain the multicolor electrode structure. As shown in table 4, the solar cell with the multicolor electrode structure in the fourth embodiment can function normally. The open circuit voltage is 0.746 V, the short circuit current density is 9.305 mA/cm$^2$, the fill factor is 0.646, and the solar cell efficiency is 4.484%. As shown in FIG. 14 A and FIG. 14B, the current density distribution of the areas which adsorbs different dyes is uniform; therefore, the dye-adsorption apparatus and the dye-adsorption method in the disclosure can manufacture the multicolor electrode of the multicolor dye sensitized solar cell.

According to the dye-adsorption method and the dye-adsorption apparatus in the disclosure, the dye is injected into the space between the two electrodes and flow through the space so that the dye is adsorbed on a surface of one of the electrodes to obtain a dye-adsorbed electrode. Since the dye filled in the space is pushed by the following injected dye, the movement of the dye moving into the pores of the porous structure is accelerated. Moreover, an amount of the dye which is about to fill the space between the two electrodes is enough to perform the dye-adsorption method in the disclosure. There in no necessary to prepare an amount of the dye which the electrodes can be totally immersed in when performing the conventional dye adsorption method. In addition, the pushing force applied on the dye helps the dye to overcome an interference caused by the surface tension so that the dye enters the small pores more easily, and a total surface area which adsorbs the dye is improved, and the dye can be uniformly distributed in the pores with different radius; therefore, the efficiency of the solar cell is improved.

Moreover, in the dye-adsorption method and the dye-adsorption apparatus of the disclosure, the dye is injected and flow through the space between the two electrodes in the dye-adsorption method of the disclosure so that the injection force applied on the dye also push the dye to move into the porous structure on the electrode surface. Therefore, adjusting the injection speed of the dye, which is proportion to the injection force of the dye, can adjust the velocity and amount of the dye entering the porous structure so that the stability of the electrodes manufactured in different batch is improved.

Moreover, in the dye-adsorption method and the dye-adsorption apparatus of the disclosure, the different dyes flowing through different electrode inlet and electrode outlet are adsorbed on the porous structures at different area on the conductive glass, respectively. Therefore, the dye-adsorption apparatus and the dye-adsorption method in the disclosure can manufacture the multicolor electrode

What is claimed is:

1. A dye adsorption method, comprising:
   a dye adsorption step, wherein a dye is injected into and flowed through a space between two electrodes of a solar cell facing each other to form at least one dye-adsorbed electrode, wherein the dye adsorption step comprises:
   a dye injection step, wherein the dye is injected into and flowed forward through the space between the two electrodes facing each other to form the at least one dye-adsorbed electrode; and
   a dye removing step, wherein a part of the dye which is not adsorbed by the at least one dye-adsorbed electrode is removed backward from the space.

2. The dye adsorption method according to claim 1, wherein a temperature of the two electrodes in the dye adsorption step is 20° C. to 60° C.

3. The dye adsorption method according to claim 1, further comprising a gas phase electrode-cleaning step performed before the dye adsorption step, wherein the gas phase electrode-cleaning step comprises:
   a cleaning gas injection step, wherein the cleaning gas is injected into and flowed through the space between the two electrodes; and
   a cleaning gas discharge step performed after the cleaning gas injection step, wherein the cleaning gas in the space between the two electrodes is discharged to keep the space at a vacuum state.

4. The dye adsorption method according to claim 3, wherein the cleaning gas injection step and the cleaning gas discharge step are performed alternately.

5. The dye adsorption method according to claim 1, further comprising a liquid phase electrode-cleaning step, wherein a cleaning liquid is injected into and flowed through the space after the at least one dye-adsorbed electrode being formed.

6. The dye adsorption method according to claim 5, wherein the liquid phase electrode-cleaning step comprises:
   a cleaning liquid injection step, wherein the cleaning liquid is injected into and flowed forward through the space; and
   a cleaning liquid discharge step performed after the cleaning liquid injection step, wherein the cleaning liquid is discharged backward from the space.

7. The dye adsorption method according to claim 5, wherein the dye driven by a liquid-driving pump passes a multi-way control valve and flows through the space to form the at least one dye-adsorbed electrode, and then the cleaning liquid driven by the liquid-driving pump passes the multi-way control valve and flows through the space.

8. The dye adsorption method according to claim 5, further comprising a gas phase drying step performed after the liquid phase electrode cleaning step, wherein the gas phase drying step comprises:
   a drying gas injection step, wherein a drying gas is injected into and flow through the space; and
   a drying gas discharge step performed after the drying gas injection step, wherein the drying gas in the space is discharged to keep the space at a vacuum state.

9. The dye adsorption method according to claim 8, wherein the drying gas injection step and the drying gas discharge step are performed alternately.

10. The dye adsorption method according to claim 1, wherein the dye comprises an organometallic coordination complex with ruthenium or zinc coordination centre, the organometallic coordination complex has an electron-donating group, a $\pi$ bond and an electron-accepting group.

* * * * *